(12) United States Patent
Clarke et al.

(10) Patent No.: US 10,658,586 B2
(45) Date of Patent: May 19, 2020

(54) RRAM DEVICES AND THEIR METHODS OF FABRICATION

(71) Applicant: Intel Corporation, Santa Clara, CA (US)

(72) Inventors: James S. Clarke, Portland, OR (US); Ravi Pillarisetty, Portland, OR (US); Uday Shah, Portland, OR (US); Tejaswi K. Indukuri, Portland, OR (US); Niloy Mukherjee, Portland, OR (US); Elijah V. Karpov, Portland, OR (US); Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/099,173

(22) PCT Filed: Jul. 2, 2016

(86) PCT No.: PCT/US2016/040889
§ 371 (c)(1),
(2) Date: Nov. 5, 2018

(87) PCT Pub. No.: WO2018/009156
PCT Pub. Date: Jan. 11, 2018

(65) Prior Publication Data
US 2019/0214559 A1    Jul. 11, 2019

(51) Int. Cl.
*H01L 45/00* (2006.01)
*H01L 27/24* (2006.01)
*G11C 13/00* (2006.01)

(52) U.S. Cl.
CPC ........ *H01L 45/146* (2013.01); *H01L 27/2436* (2013.01); *H01L 27/2463* (2013.01);
(Continued)

(58) Field of Classification Search
CPC .................................................. H01L 45/146
See application file for complete search history.

(56) References Cited

U.S. PATENT DOCUMENTS 9,799,705 B1 * 10/2017 Yi .................... H01L 45/1683
10,297,749 B1 * 5/2019 Hashemi ............ G11C 13/0004
(Continued)

OTHER PUBLICATIONS

International Preliminary Report on Patentability for International Patent Application No. PCT/US2016/040889, dated Jan. 17, 2019, 13 pages.
(Continued)

*Primary Examiner* — Thao P Le
(74) *Attorney, Agent, or Firm* — Schwabe, Williamson & Wyatt, P.C.

(57) ABSTRACT

Embodiments of the present invention include RRAM devices and their methods of fabrication. In an embodiment, a resistive random access memory (RRAM) cell includes a conductive interconnect disposed in a dielectric layer above a substrate. An RRAM device is coupled to the conductive interconnect. An RRAM memory includes a bottom electrode disposed above the conductive interconnect and on a portion of the dielectric layer. A conductive layer is formed on the bottom electrode layer. The conductive layer is separate and distinct from the bottom electrode layer. The conductive layer further includes a material that is different from the bottom electrode layer. A switching layer is formed on the conductive layer. An oxygen exchange layer is formed on the switching layer and a top electrode is formed on the oxygen exchange layer.

25 Claims, 25 Drawing Sheets

(52) U.S. Cl.
CPC ........ *H01L 45/085* (2013.01); *H01L 45/1233* (2013.01); *H01L 45/1253* (2013.01); *H01L 45/1266* (2013.01); *H01L 45/1625* (2013.01); *H01L 45/1633* (2013.01); *H01L 45/1675* (2013.01); *G11C 13/0007* (2013.01)

(56) References Cited

U.S. PATENT DOCUMENTS

| | | |
|---|---|---|
| 2010/0155687 A1 | 6/2010 | Reyes et al. |
| 2010/0224850 A1 | 9/2010 | Baek et al. |
| 2012/0223286 A1 | 9/2012 | Yang et al. |
| 2013/0328005 A1 | 12/2013 | Shin et al. |
| 2014/0166958 A1* | 6/2014 | Barabash ............ H01L 45/1253 257/1 |
| 2014/0183432 A1* | 7/2014 | Barabash ................ H01L 45/08 257/2 |
| 2014/0268995 A1 | 9/2014 | Joo et al. |
| 2015/0016178 A1* | 1/2015 | Nardi ...................... H01L 45/08 365/148 |
| 2019/0348466 A1* | 11/2019 | Pillarisetty ........ H01L 29/41733 |

OTHER PUBLICATIONS

International Search Report and Written Opinion for International Patent Application No. PCT/US2016/040889 dated Mar. 30, 2017, 16 pgs.

\* cited by examiner

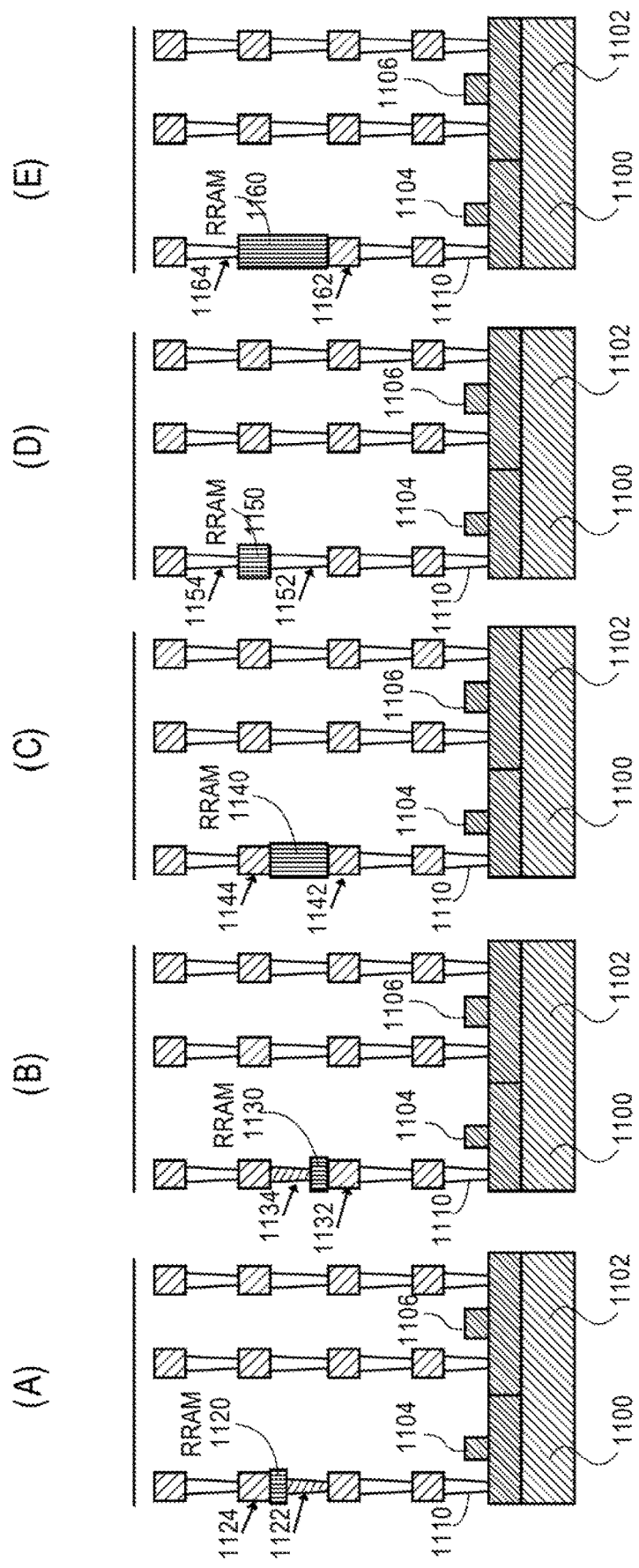

RRAM DEVICES AND THEIR METHODS OF FABRICATION

CROSS-REFERENCE TO RELATED APPLICATION

This patent application is a U.S. National Phase Application under 35 U.S.C. § 371 of International Application No. PCT/US2016/040889, filed Jul. 2, 2016, entitled "RRAM DEVICES AND THEIR METHODS OF FABRICATION," which designates the United States of America, the entire disclosure of which is hereby incorporated by reference in its entirety and for all purposes.

TECHNICAL FIELD

Embodiments of the invention are in the field of integrated circuit fabrication and, in particular, RRAM devices and their methods of fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. It has become increasingly significant to rely heavily on innovative fabrication techniques to meet the exceedingly tight tolerance requirements imposed by scaling.

Non-volatile embedded memory with RRAM devices, e.g., on-chip embedded memory with non-volatility can enable energy and computational efficiency. However, the technical challenges of creating an appropriate stack for fabrication of RRAM devices that exhibit high device endurance, high retention and operability at low voltages and currents presents formidable roadblocks to commercialization of this technology today. Specifically, the objective of memory technology to control tail bit data in a large array of memory bits necessitates tighter control of the variations in metal oxide break down and switching events in individual bits. Furthermore, in filamentary RRAM systems, the latter is dictated by fine tuning oxygen vacancy concentration which is widely understood to drive filament formation and dissolution in metal oxide films. As such, significant improvements are still needed in the area of metal oxide stack engineering which rely on material advancements, deposition techniques or a combination of both. This area of process development is an integral part of the non-volatile memory roadmap.

BRIEF DESCRIPTION OF THE DRAWINGS

FIG. 3A illustrates a conductive interconnect surrounded by a first dielectric layer.

FIG. 3B illustrates the structure of FIG. 3A following the formation of a bottom electrode layer on the conductive interconnect and a conductive layer on the bottom electrode.

FIG. 3C illustrates the structure of FIG. 3B following a partial oxidation of the conductive layer.

FIG. 3D illustrates the structure of FIG. 3B following a complete oxidation of the conductive layer.

FIG. 3E illustrates the structure of FIG. 3D following the formation of a material layer stack on the oxidized conductive layer.

FIG. 3F illustrates a resist pattern formed on a dielectric hardmask layer formed on the material layer stack.

FIG. 3G illustrates the structure of FIG. 3F following an etch process used to transfer the resist pattern into the dielectric hardmask layer to form a dielectric hardmask pattern.

FIG. 3H illustrates the structure of FIG. 3G following the removal of the resist pattern.

FIG. 3I illustrates the structure of FIG. 3H following an etch process used to transfer the dielectric hardmask pattern into the material layer stack to form a resistive random access memory device.

FIG. 3J illustrates the structure of FIG. 3I following the formation of a dielectric spacer layer covering the sidewalls of the resistive random access memory device, the top dielectric hardmask pattern and the top of the first dielectric layer surrounding the conductive interconnect.

FIG. 3K illustrates the structure of FIG. 3J following an anisotropic plasma etch of the dielectric spacer layer to form a dielectric spacer.

FIG. 3L illustrates the structure of FIG. 3K following formation of a second dielectric layer covering the resistive random access memory device, the dielectric hardmask pattern, the dielectric spacer and the first dielectric layer surrounding the conductive interconnect.

FIG. 3M illustrates the structure of FIG. 3L following planarization of the second dielectric layer, the dielectric spacer, and the top portion of the top electrode.

FIG. 5A illustrates a conductive interconnect formed in a first dielectric layer above a substrate.

FIG. 5O illustrates the structure of FIG. 5N following a planarization process to form a top electrode, an oxygen exchange layer, a metal oxide switching layer, and a conductive layer.

FIG. 6A illustrates a conductive interconnect formed in an opening in a first dielectric layer above a substrate.

FIG. 6B illustrates the structure of FIG. 6A following the formation of a bottom electrode layer on the uppermost surface of the conductive interconnect and on the uppermost surface of the first dielectric layer, followed by formation of a dielectric hardmask material on the bottom electrode material, and formation of a resist pattern on the dielectric hardmask material.

FIG. 6C illustrates the structure of FIG. 6B following patterning of the dielectric hardmask layer to form a dielectric hardmask layer, followed by removal of the mask.

FIG. 6D illustrates the structure of FIG. 6C following an etch process used to transfer a pattern of the dielectric hardmask layer into the bottom electrode layer to form a bottom electrode, followed by formation of a second dielectric layer over the dielectric hardmask layer.

FIG. 6E illustrates the structure of FIG. 6D following planarization of dielectric hardmask layer, a top portion of the bottom electrode and portions of the second dielectric layer.

FIG. 7A illustrates the formation of a conductive layer on a bottom electrode layer.

FIG. 7B illustrates the structure of FIG. 7A during a plasma oxidation process, in accordance with an embodiment of the present invention.

FIG. 7C illustrates the structure of FIG. 7A during an oxidation process, where the substrate is placed on a heated chuck of a tool in the presence of an oxygen ambient, in accordance with an embodiment of the present invention.

FIG. 7D illustrates the structure of FIG. 7A during an oxidation process, where the substrate is heated in a furnace in the presence of an oxygen ambient.

FIGS. 11A-11E illustrate schematic views of several options for positioning an RRAM element in an integrated circuit, in accordance with embodiments of the present invention.

DESCRIPTION OF THE EMBODIMENTS

Figure 1A:
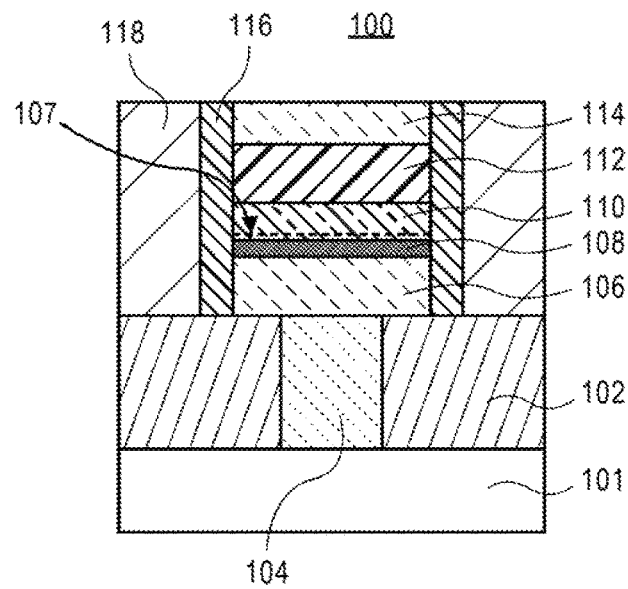
FIG. 1A illustrates a cross-sectional view of a resistive random access memory (RRAM) cell formed on top of a conductive electrode and a first dielectric layer, and surrounded by a dielectric spacer and a second dielectric layer, in accordance with an embodiment of the present invention.

RRAM devices and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

To provide context, integrating a memory array with low voltage logic circuitry, such as logic circuitry operational at a voltage less than or equal to 1 Volt, may be advantageous since it enables higher operation speeds compared to having physically separate logic and memory chips. Additionally, approaches to integrating an RRAM device onto a transistor to create embedded memory presents material challenges that have become far more formidable with scaling. As transistor operating voltages are scaled down in an effort to become energy efficient, RRAM memory devices that are connected in series with such transistors are also required to function at lower voltages and currents.

Figure 8:
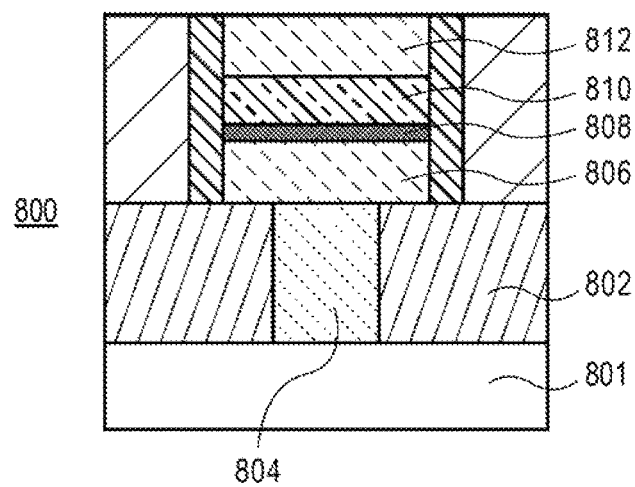
FIG. 8 illustrates a cross-sectional view of a conventional RRAM device.

FIG. 8 illustrates a cross-sectional view of a conventional RRAM device 800. The RRAM device 800 includes a top electrode 812, an oxygen exchange layer 810, a metal oxide switching layer 808, and a bottom electrode 806. The RRAM device 800 is above an interconnect 804 formed in a dielectric layer 802 above a substrate 801.

The metal oxide switching layer 810 of RRAM device 800 is a region where conductive filaments are formed in filamentary RRAM devices. The interface region between the metal oxide switching layer and the bottom electrode requires particular attention during the deposition process. An interaction between oxygen in the metal oxide switching layer and the bottom electrode layer can create an additional undesirable metal oxide alloy layer in the interface region during the process of forming the metal oxide switching layer. The metal oxide alloy layer can lead to uncontrolled resistance changes in the RRAM device 800 leading to degradation and variability in the switching behavior. Such operational variability manifests in write voltage and write current variability leading to erroneous programming states of a device. In accordance with an embodiment of the present invention, a conductive layer initially devoid of oxygen is inserted between the bottom electrode and the metal oxide switching layer, and formation of the undesirable metal oxide alloy layer is prevented. Once formed on the bottom electrode, the conductive layer may be oxidized by various oxidation schemes, thereby preventing the bottom electrode from being subjected to any oxygen that would ordinarily result from forming the metal oxide switching layer 808 directly on the bottom electrode 806. Such a process may lead to reduced variability. Benefits such as creating a higher density RRAM array at scaled dimensions may be realized when such variability is minimized.

In accordance with embodiments of the present invention, various examples of RRAM devices including an extended metal oxide switching layer are described in association with FIGS. 1A-1C and FIGS. 2A-2C.

FIG. 1A illustrates a cross-sectional view of a resistive random access memory (RRAM) cell formed on top of a conductive electrode and a first dielectric layer, and surrounded by a dielectric spacer and a second dielectric layer, in accordance with an embodiment of the present invention. In an embodiment, the conductive interconnect 104 includes a barrier layer, such as tantalum nitride, and a fill material, such as copper, as is known in the art. The conductive interconnect 104 is disposed within a dielectric layer 102 disposed above a substrate 101.

The RRAM device 100 includes a bottom electrode 106 disposed above the conductive interconnect 104. A conductive layer 108 is disposed on the bottom electrode 106. A metal oxide switching layer 110 is disposed on the conductive layer 108. An oxygen exchange layer 112 is disposed on the metal oxide switching layer 110. A top electrode 114 is disposed on the oxygen exchange layer 112. In an embodiment, the bottom electrode 106 extends laterally onto a portion of the dielectric layer 102, as is depicted.

A dielectric spacer 116 is disposed adjacent and on sidewalls of the RRAM device 100 and on the first dielectric layer 102. The dielectric spacer 116 extends from the uppermost surface of the first dielectric layer 102 to an uppermost surface of the top electrode 114 and may be any suitable dielectric layer such as but not limited to carbon doped silicon nitride or silicon nitride. In an embodiment, the dielectric material of the dielectric spacer 116 is a non-oxygen-containing material. A second dielectric layer 118 is disposed on the first dielectric layer 102 and laterally adjacent to the dielectric spacer 116. An uppermost surface of the second dielectric layer 118 is coplanar or substantially coplanar with an uppermost surface of the dielectric spacer 116 and the uppermost surface of the top electrode 112.

In an embodiment, the bottom electrode 106 includes a material such as but not limited to titanium nitride, tantalum, tantalum nitride, tungsten or ruthenium. In an embodiment, the bottom electrode 106 has a thickness in the range of 40 to 100 nanometers (nm). In an embodiment, the composition and thickness of the bottom electrode 106 are tuned to meet specific device attributes such as series resistance, programming voltage and current. In an embodiment, the bottom electrode 106 has a thickness in the range of 40 to 100 nanometers (nm). In an embodiment, the composition and thickness of the bottom electrode 106 are tuned to meet specific device attributes such as series resistance, programming voltage and current.

In an embodiment, the conductive layer 108 is a material that is retained following a protective capping process that protects the bottom electrode 106 during a subsequent deposition process of a metal oxide layer. For example, in an embodiment, a metal or metal containing material is first formed on the bottom electrode 106. The metal or metal containing material is then at least partially oxidized, and may be even fully oxidized. In the case that the metal or metal containing material is only partially oxidized, a portion of the metal or metal containing material is retained as the conductive layer 108, as is depicted in FIG. 1. Partial or complete oxidation processes for the metal or metal containing material are described below.

In an embodiment the remaining conductive layer 108 is composed of a material such as but not limited to hafnium, tantalum or titanium. In an embodiment, the conductive layer 108 includes a metal similar to the metal in the metal oxide switching layer 110. In an embodiment, the conductive layer is composed of a highly oxidizable material. The material of the conductive layer 108 may be capable of having an oxygen gradient across a vertical direction. In an embodiment, the conductive layer 108 is sufficiently thin such that the conductive layer 108 does not act as a lower oxygen layer. In an embodiment, the conductive layer 108 has a thickness in the range of 1 to 3 nanometers (nm).

In an embodiment, the metal oxide switching layer 110 is formed directly on the remaining conductive layer 108. In one such embodiment, the metal oxide switching layer 110 includes a lower portion 107 that is an oxidized portion of the initial metal or metal containing material from which the conductive layer 108 remains. That is, the partially oxidized portion of the conductive layer ultimately becomes part of a switching layer for an RRAM cell. In one embodiment, the partially oxidized portion of the conductive layer is indistinguishable from the metal oxide switching layer 110. In another embodiment, a seam is present at an interface of the partially oxidized portion of the conductive layer and the metal oxide switching layer 110.

In an embodiment, the metal oxide switching layer 110 is composed of a metal (M), such as but not limited to, hafnium, tantalum or titanium. In the case of titanium or hafnium, or tantalum with an oxidation state+4, the metal oxide switching layer 110 has a chemical composition, $MO_X$, where O is oxygen and X is or is substantially close to 2. In the case of tantalum with an oxidation state+5, the metal oxide switching layer 110 has a chemical composition, $M_2O_X$, where O is oxygen and X is or is substantially close to 5. In an embodiment, the metal oxide switching layer 110 has a thickness approximately in the range of 1-5 nm.

In an embodiment, the oxygen exchange layer 112 acts as a source of oxygen vacancy or as a sink for $O^{2-}$. In an embodiment the oxygen exchange layer 112 is composed of a metal such as but not limited to, hafnium, tantalum or titanium. In an embodiment, oxygen exchange layer 112 has a thickness in the range of 5-20 nm. In an embodiment, the thickness of the oxygen exchange layer 112 is at least twice the thickness of the metal oxide switching layer 110. In another embodiment, the thickness of the oxygen exchange layer 112 is at least twice the thickness of the metal oxide switching layer 110.

In an embodiment, the top electrode 114 is composed of a material such as, but not limited to, titanium nitride, tantalum nitride, tungsten and ruthenium. In an embodiment, the bottom electrode 106 and the top electrode 114 are composed of the same material. In an embodiment, the top electrode 114 has a thickness approximately in the range of 30 to 100 nm. In an embodiment, the composition and thickness of the top electrode 114 are tuned to meet specific device attributes such as series resistance, programming voltage and current.

Figure 1B:
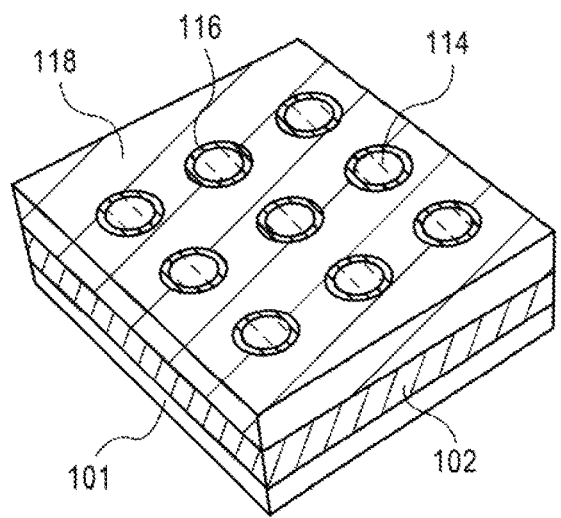
FIG. 1B illustrates a plan view of an array of RRAM cells of the type illustrated in FIG. 1A, in accordance with an embodiment of the present invention.
Figure 1C:
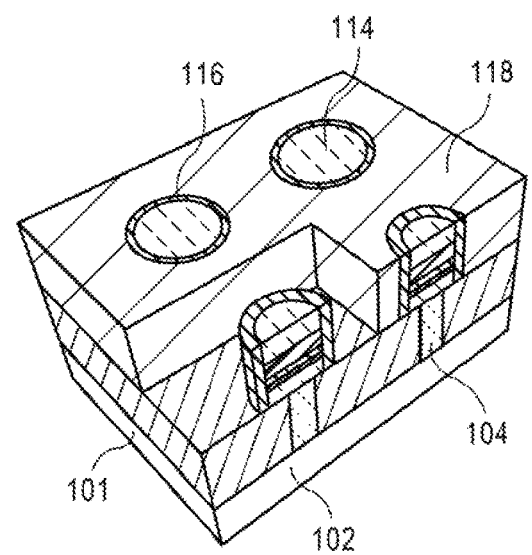
FIG. 1C illustrates a partial cross-sectional view of the array of RRAM cells illustrated in FIG. 1B, in accordance with an embodiment of the present invention.

FIG. 1C illustrates a plan view of an array of RRAM cells of the type illustrated in FIG. 1A, in accordance with an embodiment of the present invention. In an embodiment, an RRAM array may include $10^3$-$10^8$ RRAM cells. In an embodiment, electrical contact is made to the top electrode 114 of each RRAM device 100 through subsequent formation of conductive interconnects.

Figure 2A:
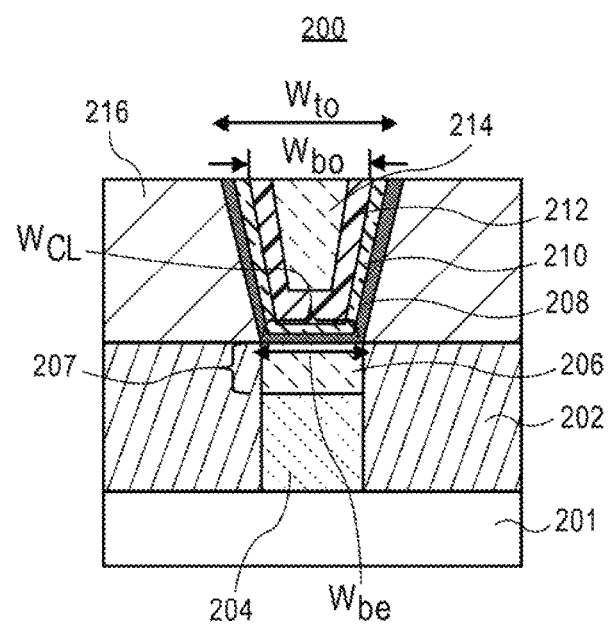
FIG. 2A illustrates a cross-sectional view of an RRAM cell where a conductive layer, a metal oxide switching layer, an oxygen exchange layer and a top electrode are disposed in an opening in a dielectric layer, in accordance with an embodiment of the present invention.

FIG. 2A illustrates a cross-sectional view of an RRAM cell where a conductive layer 208, a metal oxide switching layer 210, an oxygen exchange layer 212 and a top electrode 214 are disposed in an opening in a dielectric layer 216, in accordance with an embodiment of the present invention. The RRAM cell includes an RRAM device 200 disposed on a conductive interconnect 204, such as a conductive line or via, disposed in a first dielectric layer 202, disposed above a substrate 201. The conductive interconnect 204 is recessed to provide a recess 207, and the bottom electrode 206 of the RRAM device 200 is included in the recess 207. The conductive layer 208, the metal oxide switching layer 210, the oxygen exchange layer 212 and the top electrode 214 are disposed in an opening of a second dielectric layer 216 disposed above the first dielectric layer 202. The conductive layer 208 is disposed on the bottom electrode 206 included in the recess 207.

In an embodiment, the bottom electrode 206 has a width, $W_{be}$, approximately equal to a width, $W_{oe}$, of the conductive layer 208. In an embodiment, an uppermost surface of the bottom electrode 206 is coplanar or substantially coplanar with the uppermost surface of the dielectric layer 202. In an embodiment, the uppermost portion of the second dielectric layer 216, conductive layer 208, the metal oxide switching layer 210, the oxygen exchange layer 212 and the top electrode 214 are coplanar or substantially coplanar with one another.

In an embodiment, dielectric layer 216 is a material that has oxygen and serves to allow oxygen diffusion into the laterally adjacent conductive layer 208. In an embodiment, the second dielectric layer 216 is composed of a material such as, but not limited to silicon nitride, carbon doped silicon nitride and silicon carbide, silicon oxynitride, silicon dioxide and carbon doped silicon oxide. In an embodiment the width, $W_{TO}$, of the top of the opening in the second dielectric layer 216 is greater than the width, $W_{BO}$, of the base of the opening. In an embodiment, the sidewalls of the opening are slanted by an angle of approximately 45 degrees with respect to a vertical axis of the opening. The width, $W_{BO}$, of the base of the opening may be larger or smaller than the width of the bottom electrode 106, $W_{BE}$. It is to be appreciated that, in an embodiment, the portion of the oxygen exchange layer 212 that overlaps with the bottom electrode 206 determines an effective device size. In an embodiment, the portion of the conductive layer 208 that is in contact with the uppermost surface of the bottom electrode 206 has a thickness that is greater than a thickness of portions of the conductive layer 208 disposed along the sidewalls of the second dielectric layer 216. In an embodiment, the width of the conductive layer, $W_{cl}$, may not be identical to the width, $W_{bo}$, of the base of the opening.

Figure 2B:
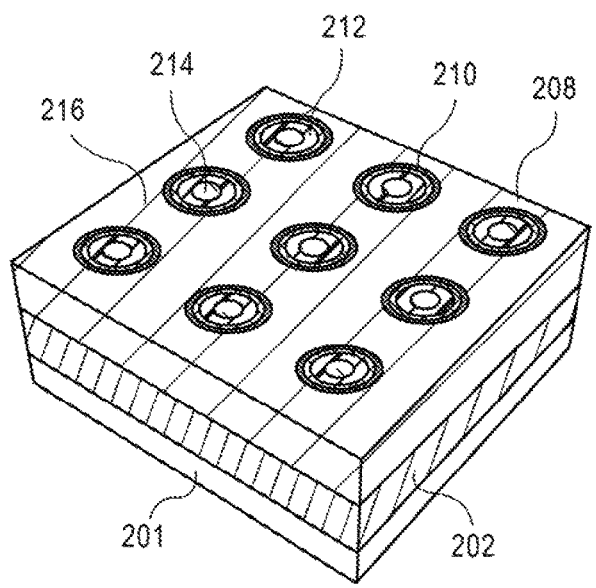
FIG. 2B illustrates a plan view of an array of RRAM cells of the type illustrated in FIG. 2A, in accordance with an embodiment of the present invention.

FIG. 2B illustrates a plan view of a sub-section of an array of RRAM cells of the type illustrated in FIG. 2A, in accordance with an embodiment of the present invention. In an embodiment, an array of RRAM cells includes $10^3$-$10^8$ RRAM cells. In an embodiment, contact is made to the top electrode 214 of each RRAM device 200, subsequently through formation of interconnects. In contrast to the RRAM devices in the array illustrated in FIG. 1B, RRAM devices 200 depicted in the array in FIG. 2B expose an uppermost surface of the top electrode 214, oxygen exchange layer 212, the metal oxide switching layer 210 and the conductive layer 208. In contrast, only the top electrode component of the RRAM device 100 is exposed in the array depicted in FIG. 1B. In an embodiment, the uppermost portion of the oxygen exchange layer 212 between the top electrode 214 and the metal oxide switching layer 210 is oxidized during subsequent fabrication of the device. In one such embodiment, a portion of the oxygen exchange layer 212 that is over the bottom electrode 206 remains protected from any potential oxidation effects.

Figure 2C:
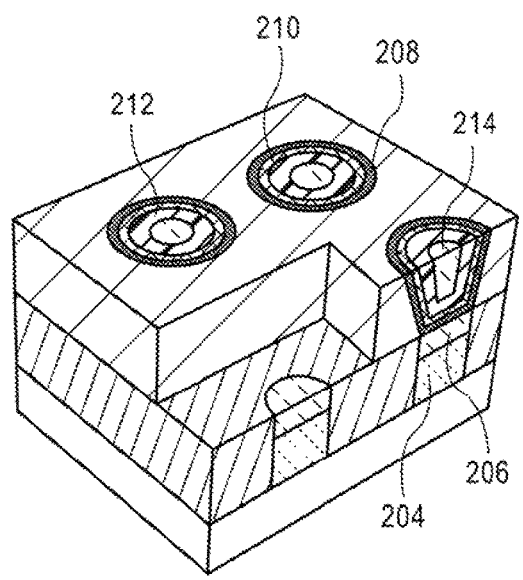
FIG. 2C illustrates a partial cross-sectional view of the array of RRAM cells illustrated in FIG. 2B, in accordance with an embodiment of the present invention.

FIG. 2C illustrates a partial cross-sectional view of the array of RRAM cells illustrated in FIG. 2B, in accordance with an embodiment of the present invention.

FIGS. 3A-3J illustrate cross-sectional views representing various operations in a method of fabricating an RRAM device integrated on a conductive interconnect, which may be used to fabricate a memory device such as described in association with FIG. 1A, in accordance with an embodiment of the present invention.

Figure 3A:
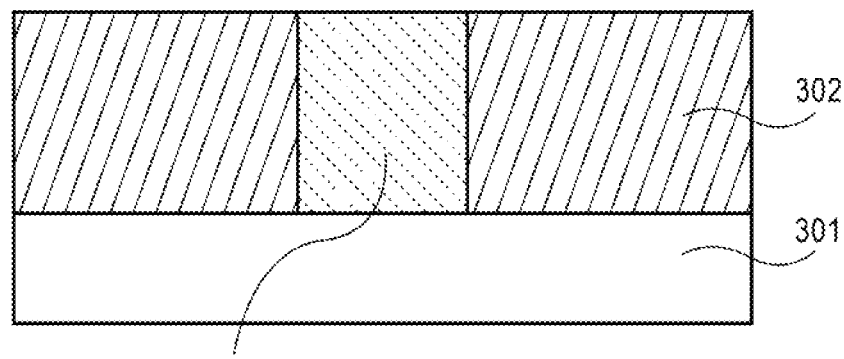
FIGS. 3A-3M illustrate cross-sectional views representing various operations in a method of fabricating an RRAM device integrated on a conductive interconnect, in accordance with an embodiment of the present invention.

FIG. 3A illustrates a cross-sectional view of a bottom electrode formed above a conductive interconnect, surrounded by a first dielectric layer 302 formed above a substrate 301. In an embodiment, one or more dielectric layers are included. Dielectric layer 302 may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer 302 may include pores or air gaps to further reduce their dielectric constant. In an embodiment, the total thickness of dielectric layer 302 may be in the range of 2000A-3000A. The conductive interconnect 304 may be fabricated using dual damascene processing or subtractive etching. The dielectric layer 302 has an uppermost surface substantially co-planar with an uppermost surface of the conductive interconnect 304.

Figure 3B:
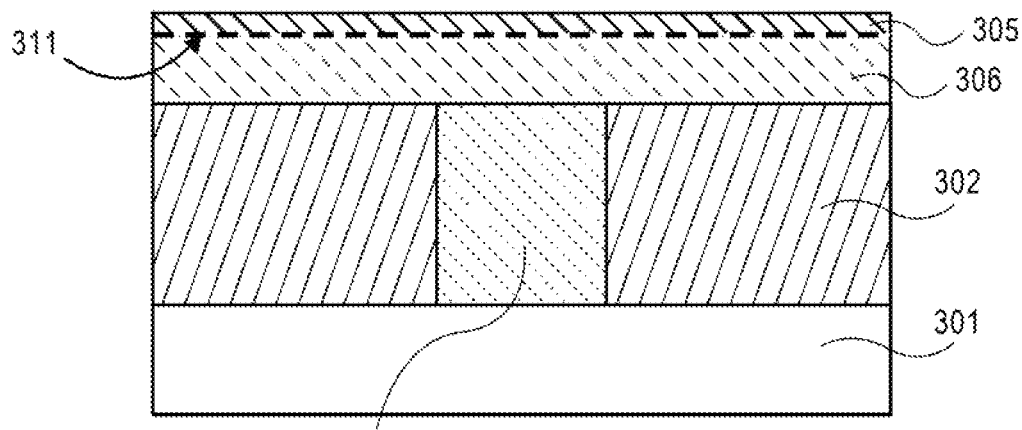

FIG. 3B illustrates the structure of FIG. 3A following the formation of a bottom electrode layer 306 on the conductive interconnect 304 and on the dielectric layer 302. A conductive layer 305 is formed on the bottom electrode layer 306.

In an embodiment, the bottom electrode layer 306 is a material having a composition and a thickness such as described above in association with the bottom electrode 106. In an embodiment, the bottom electrode layer 306 is formed using a PVD or an ALD process.

In an embodiment the bottom electrode layer 306 includes a material deposited by a physical vapor deposition (PVD) process. In one embodiment, the bottom electrode layer 306 is deposited by PVD and is composed of a material such as, but not limited to, TiN, TaN, W or Ru. In an embodiment, the bottom electrode layer 306 is deposited by PVD to a thickness approximately in the range of 30 nm to 100 nm. The process of depositing the bottom electrode layer 306 using PVD may include an in-situ sputter cleans to first remove any oxide residue from the uppermost surface of the conductive interconnect 304. For example, a gas containing Ar may be used to energetically bombard the surface of the conductive interconnect 304 to remove any native oxide. In an embodiment, the bottom electrode layer 306 is formed by a PVD process and is subsequently polished to achieve a surface roughness of 1 nm or less. Reducing surface roughness using a polishing process may offer advantages during cycling of an RRAM device as it may serve to reduce abrupt filament nucleation and hence lessen variation in cycling voltage in a large device array.

In another embodiment, the bottom electrode layer 306 is formed using an atomic layer deposition (ALD) process. The ALD process may offers advantages such as greater film thickness uniformity (~1%) compared to a PVD process (~5%), but may have a slower deposition rate, e.g., a deposition rate of 0.5 nm-2 nm/min. In one embodiment, a planarization process is not needed subsequent to depositing using an ALD process. Reducing surface roughness using an ALD process may offer advantages during cycling of an RRAM device as it serves to reduce abrupt filament nucleation and hence lessen variation in cycling voltage in a large device array. In an embodiment, the bottom electrode layer 306 is deposited by ALD and is composed of a material such as, but not limited to, TiN, TaN, W and Ru.

Referring again to FIG. 3B, a conductive layer 305 is deposited on the uppermost surface of bottom electrode layer 306. In an embodiment, the conductive layer 305 includes a metal such as, but not limited to, hafnium, titanium or tantalum. In an embodiment, the conductive layer 305 has a thickness sufficiently thick to protect the underlying bottom electrode layer 306 during a subsequent metal oxide layer deposition process involving oxidation, and sufficiently thin as to not create a lower oxygen exchange layer for a resulting RRAM device. In one embodiment, the conductive layer 305 is formed to a thickness approximately in the range of 2-3 nanometers.

In an embodiment, the conductive layer 305 is disposed on the bottom electrode layer 306 without an air-break. In one such embodiment, deposition of the conductive layer 305 involves the use of energetic ions that bombard the bottom electrode layer 306. In an embodiment, intermixing between the constituents of the bottom electrode layer 306 and the conductive layer 305 leads to formation of a conductive metal alloy interface (as illustrated by the dashed line in FIG. 3B). In one such embodiment, the alloy is composed of materials such as, but not limited to, titanium, nitrogen and hafnium. In an embodiment, the intermixing leads to an oxygen-free region.

Figure 3C:
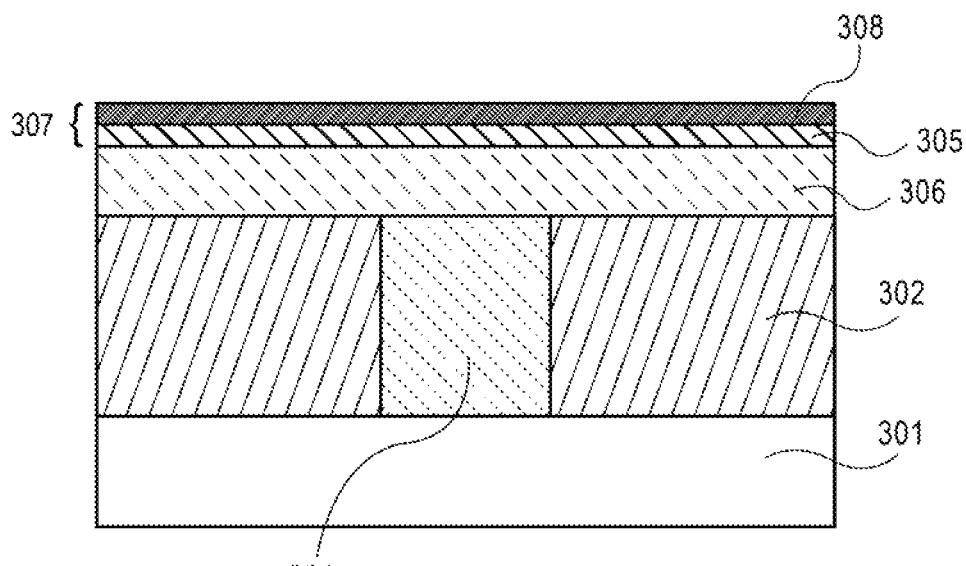

FIG. 3C illustrates the structure of FIG. 3B following a partial oxidation of the conductive layer 305 to form a partially oxidized conductive layer 307 composed of an oxidized material 308 and a conductive layer 305. Methods used to partially oxidize the conductive layer 305 are described in greater detail in association with FIGS. 7A-7D below. In an embodiment, the partially oxidized conductive layer 307 is formed by exposure to an ambient including oxygen for a time period approximately in the range of 10-30 minutes. In one such embodiment, partial oxidation results in preservation of a portion of the original conductive layer 305 adjacent to the bottom electrode, while having another, upper portion of oxidized conductive material 308 that is fully or partially oxidized, as is depicted in FIG. 3C. In one embodiment, partial oxidation of the conductive layer 305 to form the partially oxidized conductive layer 307 results in gradients in an oxygen concentration throughout the partially oxidized conductive layer 307. In an embodiment, the oxidation is performed using a technique such as, but not limited to, plasma oxidation, a furnace treatment, or by heating the substrate 301 on a chuck during exposure to an $O_2$ containing gas mixture.

Figure 3D:
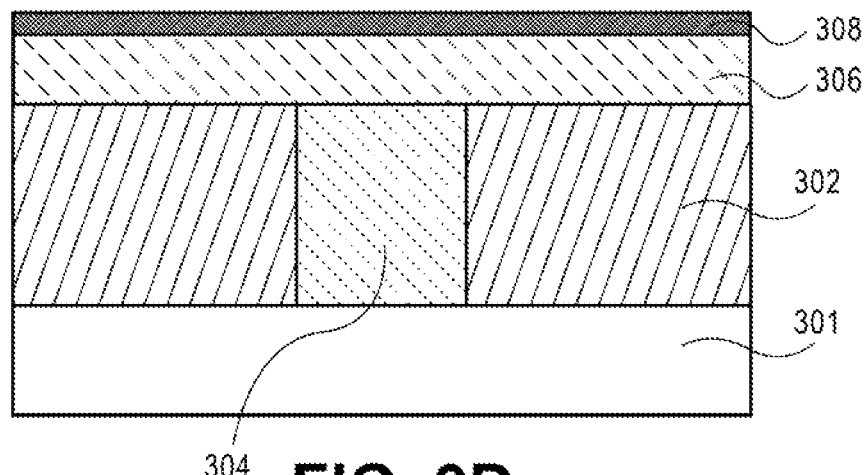

FIG. 3D illustrates the structure of FIG. 3C following a full oxidation of the conductive layer 305. In an embodiment, a fully oxidized or a nearly fully oxidized conductive layer 308 is obtained by continuing the above described oxidation of the conductive layer 305 through to complete or nearly complete oxidation. In an embodiment, such an oxidation is performed to an extent that the conductive layer 305 is thoroughly oxidized, as is depicted in FIG. 3D. In other embodiments, a full oxidation of the conductive layer 305 is not performed and the oxidation is only partial. In the latter case, a non-oxidized portion or an only partially oxidized portion of the conductive layer 305 is retained, as is illustrated in FIG. 3C, to ultimately provide a structure such as described as association with FIG. 1A.

Figure 3E:
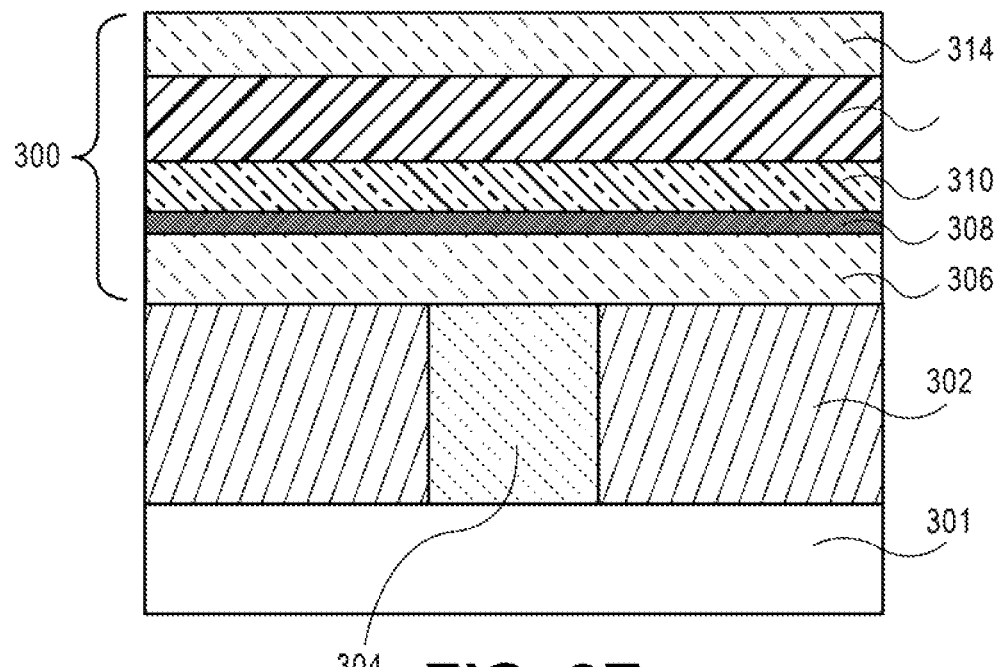

FIG. 3E illustrates the structure of FIG. 3D following the formation of a metal oxide switching material 310, an oxygen exchange material 312 and a top electrode layer 314 to form a material layer stack 300.

Referring again to FIG. 3E, in an embodiment, the metal oxide switching material 310 is formed on an oxidized layer 308 which is an oxidized portion of a partially or fully oxidized conductive layer 305. As shown in FIG. 3E and on, the metal oxide switching material 310 is formed on an oxidized layer 308 resulting from full oxidation of the conductive layer 305. In another embodiment, not shown, the metal oxide switching material 310 is formed on an only partially oxidized conductive layer 305. In an embodiment, the metal oxide switching material 310 is composed of a material having a composition and a thickness such as described above in association with the metal oxide switching material 110. In an embodiment, a switching layer for an RRAM device ultimately includes the oxidized portion 308 of the conductive layer 305 together with the metal oxide switching material 310.

In an embodiment, the metal oxide switching material 310 is formed using an ALD process. The ALD process may be characterized by a slow and a highly controlled metal oxide deposition rate. The ALD process may also be highly uniform (e.g., approximately 0.1 nm level variation). In another embodiment, the metal oxide switching material 310 is formed using a PVD process. In contrast to the ALD process, in an embodiment an energetic PVD deposition process, may cause intermixing between the metal oxide switching material 310 and an oxidized conductive layer 308. In an embodiment, the Typical thickness of the metal oxide switching layer 310 has a thickness that ranges from 2-5 nm.

Referring again to FIG. 3E, the oxygen exchange material 312 is formed on the metal oxide switching material 310. In an embodiment, the oxygen exchange material 312 is a material having a composition and a thickness such as described above in association with the oxygen exchange material 112. In an embodiment, the oxygen exchange material 312 is formed using a PVD process. In one such embodiment, the metal oxide switching material 310 and the oxygen exchange material 312 are deposited sequentially in a same chamber or in a same tool without breaking vacuum.

Referring again to FIG. 3E, the top electrode layer 314 is formed on the oxygen exchange material 312. In an embodiment, the top electrode layer 314 is a material having a composition and a thickness such as described above in association with the top electrode 114. In an embodiment, the top electrode layer 314 is formed using a PVD process. In an embodiment, the top electrode layer 314 and the oxygen exchange material 312 are deposited sequentially in a same chamber or in a same tool without breaking vacuum. By doing so, the oxygen exchange material 312 does not become oxidized. In an embodiment the top electrode layer 314 has a same composition as the bottom electrode layer 306.

Figure 3F:
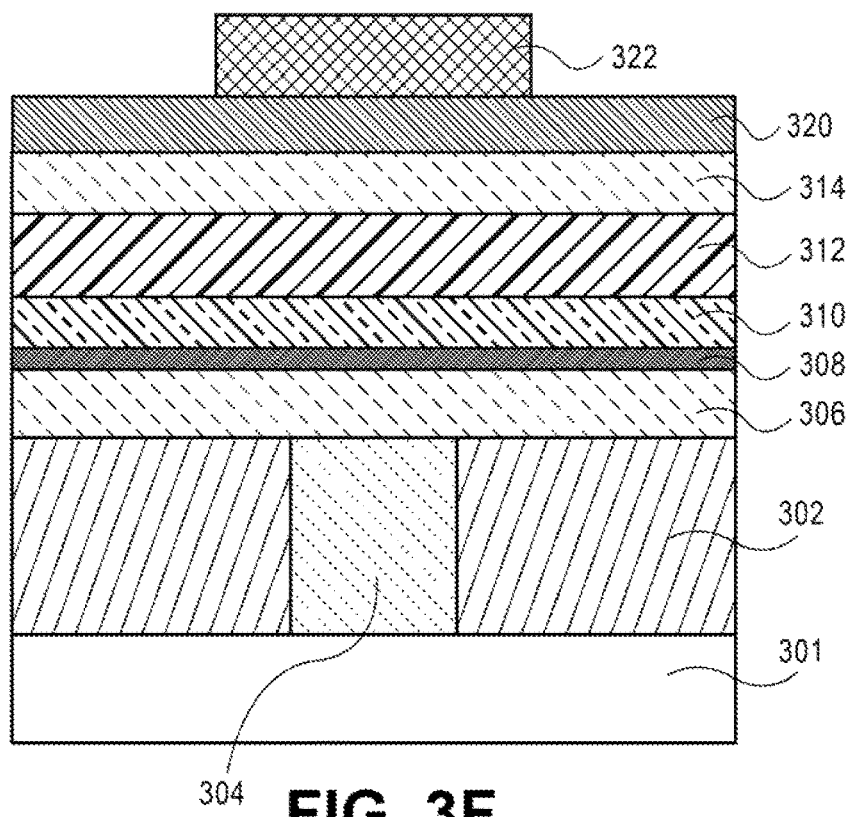

FIG. 3F illustrates a resist pattern 322 formed on a dielectric hardmask layer 320 formed on the material layer stack 300. In an embodiment, the dielectric hardmask material 320 is devoid of oxygen. In one embodiment, the dielectric hardmask material 320 is a material such as, but not limited to, silicon nitride, silicon carbide or carbon-doped silicon nitride. In one embodiment, the dielectric hardmask material 320 has a thickness approximately in the range of 50-100 nm. The thickness of the dielectric hardmask layer 320 may be determined by patterning fidelity and subsequent processing tolerances, as will be discussed further below.

In an embodiment, resist pattern 322 has a shape that ultimately defines a shape of an RRAM device fabricated from the material layer stack 300. In one embodiment, the resist pattern 322 has rectangular shape or a circular shape. In one embodiment, the resist pattern 322 has a shortest width in the range of 20-100 nm. Resist pattern 322 may include one or more materials such as an anti-reflective coating (ARC), gap-fill and planarizing material in addition to or in place of a photoresist material. In one embodiment, the resist pattern 322 is formed to a thickness sufficient to retain its profile during subsequent patterning of the dielectric hardmask material 320 but not so thick as to prevent lithographic patterning into the smallest dimensions (e.g., critical dimensions) possible with photolithography processing.

Figure 3G:
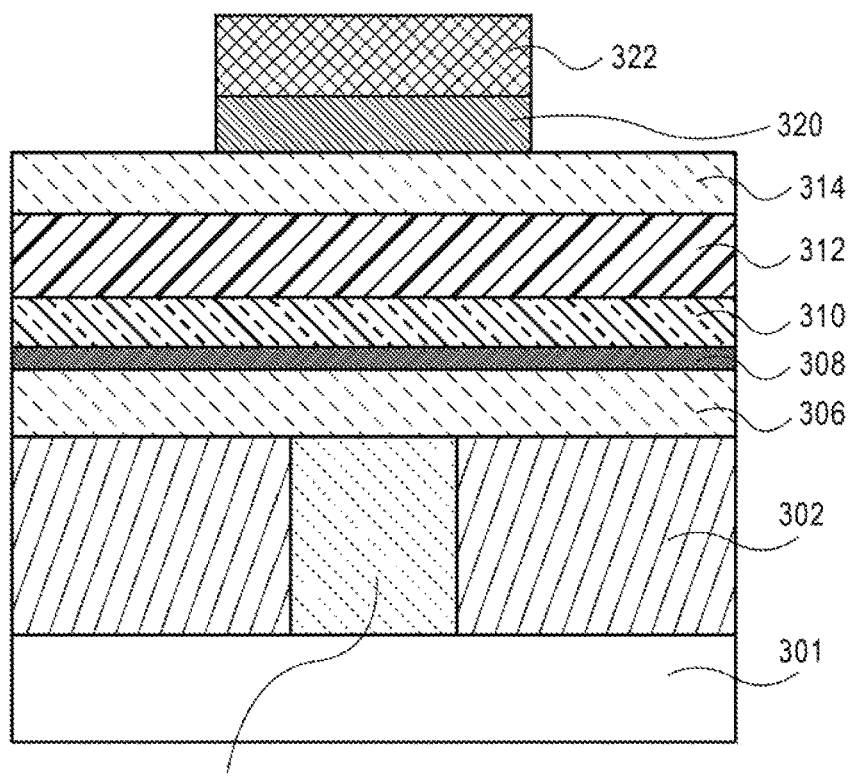

FIG. 3G illustrates the structure of FIG. 3F following an etch process used to transfer the pattern of resist pattern 322 into a dielectric hardmask layer 320. In an embodiment, an anisotropic plasma etch process is used to pattern dielectric hardmask layer 320 with selectivity to the resist pattern 322. In an embodiment, a selectivity of greater than 3 to 1 between photoresist material and dielectric hardmask layer 320 is achieved. It is to be appreciated that chemical etchants utilized in the plasma etch process may depend on the dielectric material being etched, and may include one or more of $CH_xF_y$, $O_2$, Ar, $N_2$ and $CF_4$. Sidewall angles of the patterned dielectric hardmask layer 320 may be tailored to vary from 85-90 degrees depending on the type of etch conditions employed.

Figure 3H:
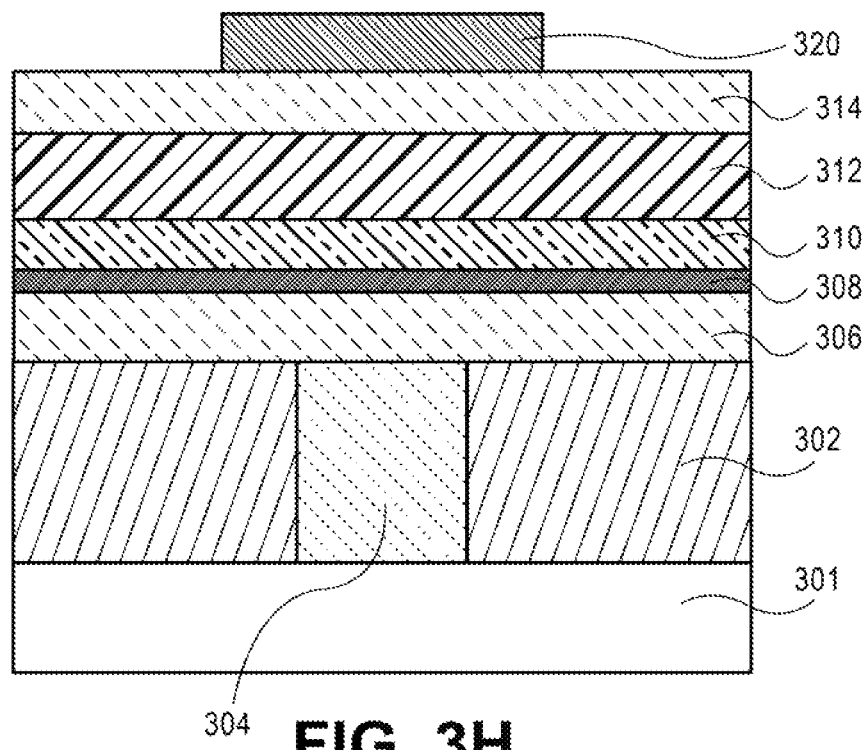

FIG. 3H illustrates the structure of FIG. 3G following removal of the resist pattern 322 selectively to the dielectric hardmask layer 320. In an embodiment, the resist pattern 322 is removed using an ash process. The ash process may include use of a gas containing $O_2$, $H_2/N_2$, etc. It is to be appreciated that polymeric films, which may result from the interaction between a photoresist material and etch byproducts during memory device etch, may adhere to the sidewall portions of an etched RRAM material stack 300. If portions of such polymeric layers have metallic components, device performance may be significantly degraded. As such, in one embodiment, the resist pattern 322 is removed prior to etching the material stack 300.

Figure 3I:
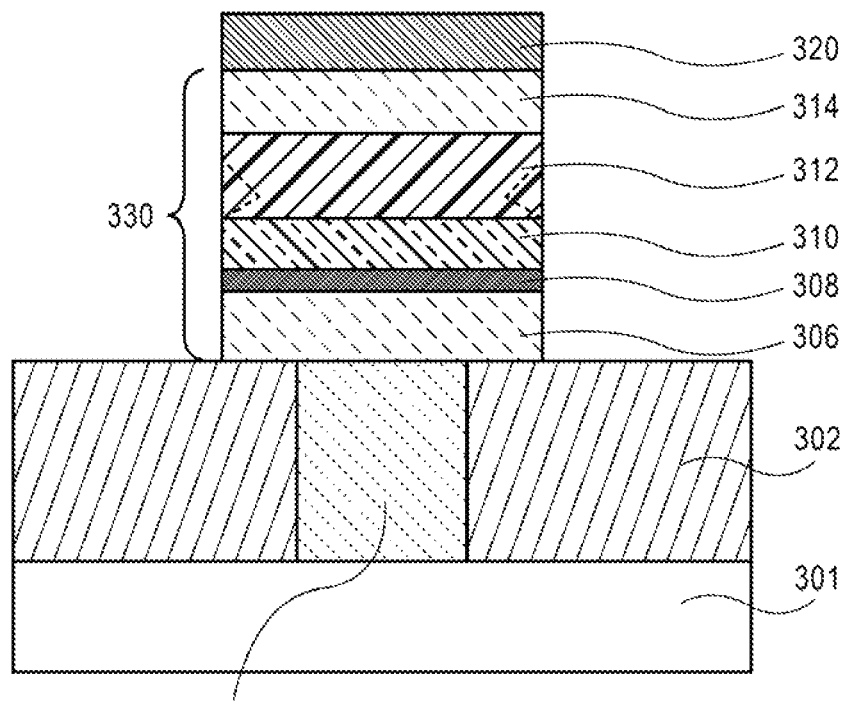

FIG. 3I illustrates the structure of FIG. 3H following an etch process used to transfer the dielectric hardmask pattern into the material layer stack 300 to form a resistive random access memory device 330. In one embodiment, etching of the top electrode 314 and the oxygen exchange layer 312 is performed in a single introduction in an etch tool to etch all layers of the material layer stack 300 in a single pass. However, different chemistries may be utilized in the etch recipes. In an embodiment, a TiN top electrode layer 314 is etched using a reactive ion etch with chemistry including Ar, CF4 and Cl2. In an embodiment, a hafnium-based oxygen exchange layer 312 is etched using BCl3, Cl2, and Ar. In an embodiment, where the oxygen exchange layer 312, the metal oxide switching layer 310 and the conductive layer 308 include a same metal, such as Hf, the etch may be carried out with BCl3, Cl2, and Ar. In another embodiment, a Ta-based oxygen exchange layer 310 is patterned using a mixture of $CHF_x$, Ar, $Cl_2$ containing chemistry. In an embodiment, a combination of high etch selectivity to an underlying metal oxide layer and a non-uniform etch leads to notching in the oxygen exchange layer 312 during the etching process (indicated by the dotted line shown in FIG. 3I). In an embodiment, a TiN bottom electrode layer 306 is etched by a Cl2, CF4 plasma to form a bottom electrode 306.

In an embodiment, as depicted in FIG. 3I, the width of the bottom electrode 306 is larger than the width of the conductive interconnect 304. When the bottom electrode 306 is completely etched the underlying first dielectric layer 302 is exposed. Depending on the etch selectivity to the first dielectric layer, there may be a small but noticeable amount of recess in the dielectric layer 302.

Figure 3J:
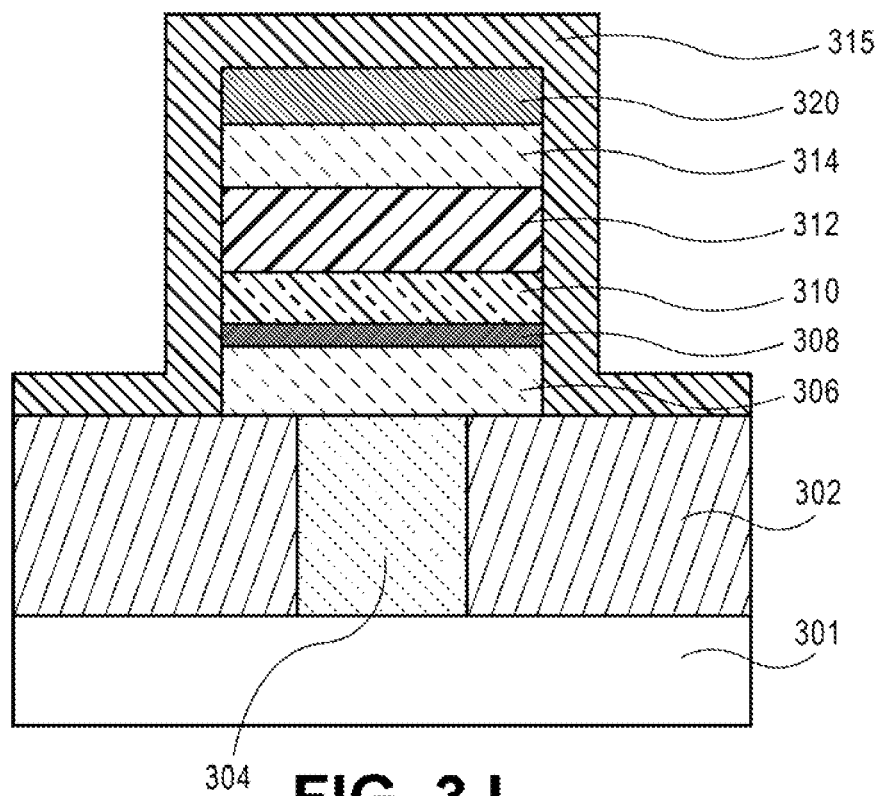

FIG. 3J illustrates the structure of FIG. 3I following the formation of a dielectric spacer layer 315 covering the sidewalls of the resistive random access memory device 330, the top dielectric hardmask pattern 320 and the top of the first dielectric layer 302 surrounding the conductive interconnect 304. In an embodiment, deposition of the dielectric spacer material 315 is performed immediately post RRAM device etch, prior to breaking vacuum in the same tool or chamber used for the etch process. Such a procedure, known in the art as in-situ deposition, may hermetically seal the device and potentially decrease oxidation of the perimeter of the sensitive metal oxide switching layer 310. In an embodiment, the dielectric spacer layer 315 is a material such as, but not limited to, silicon nitride, silicon carbide, carbon-doped silicon nitride, or any suitable non-oxygen containing material. In an embodiment, the dielectric spacer layer 315 has a thickness approximately in the range of 20-50 nm. In another embodiment, the RRAM device 330 and the dielectric hardmask layer 320 have angled sidewalls between 80-90 degrees, and the dielectric spacer material 315 is deposited to a thickness greater than 50 nm.

Figure 3K:
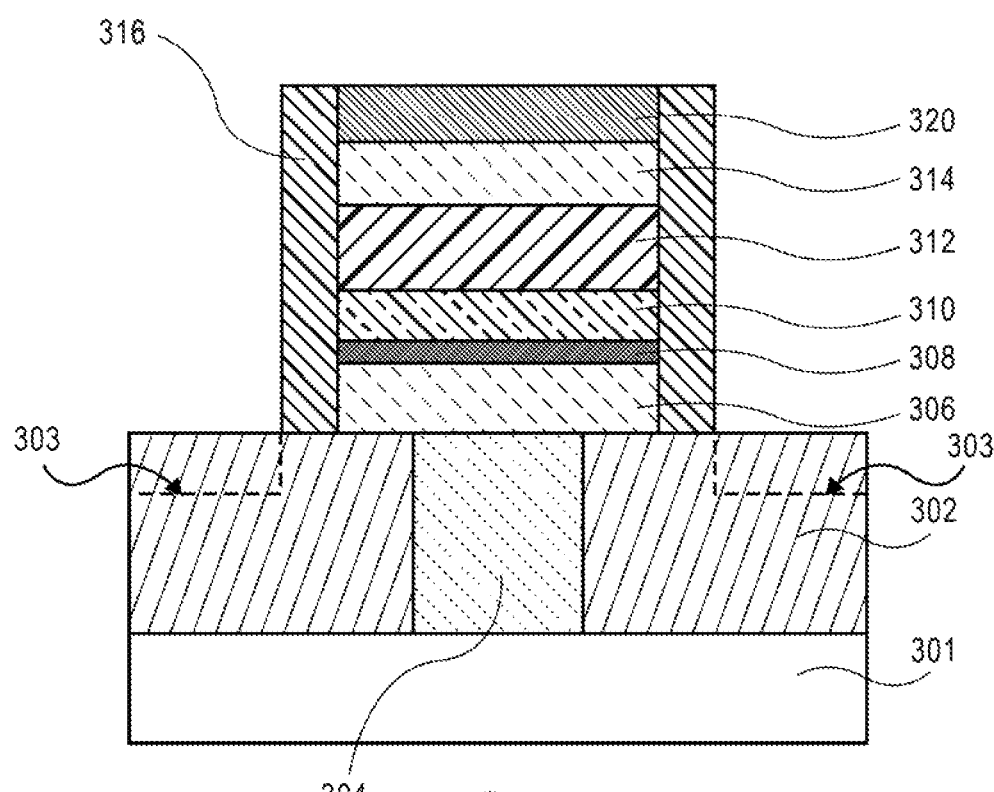

FIG. 3K illustrates the structure of FIG. 3K following an anisotropic plasma etch of the dielectric spacer layer 315 to form a dielectric spacer 316. In an embodiment, a silicon nitride or carbon doped silicon nitride dielectric spacer layer 315 is reactive-ion etched utilizing a chemistry including Ar, $O_2$, and a fluorocarbon such as but not limited to $CHF_3$, $CH_2F_2$, or $C_4F_8$.

In an embodiment, the resulting structure as depicted in FIG. 3K has a vertical dielectric spacer structure that extends from the base of the conductive layer 308 to the top of the dielectric hardmask layer 320. In an embodiment, the dielectric spacer extends above the uppermost level of the top electrode 314 but below the uppermost portions of the dielectric hardmask layer 320. In an embodiment when the first dielectric layer 302 is exposed post formation of the bottom electrode layer 306, there may be a small but noticeable amount of recess 303 in the dielectric layer 302 depending on the etch selectivity to the first dielectric layer 302 (indicated by the dotted line in FIG. 3K).

Figure 3L:
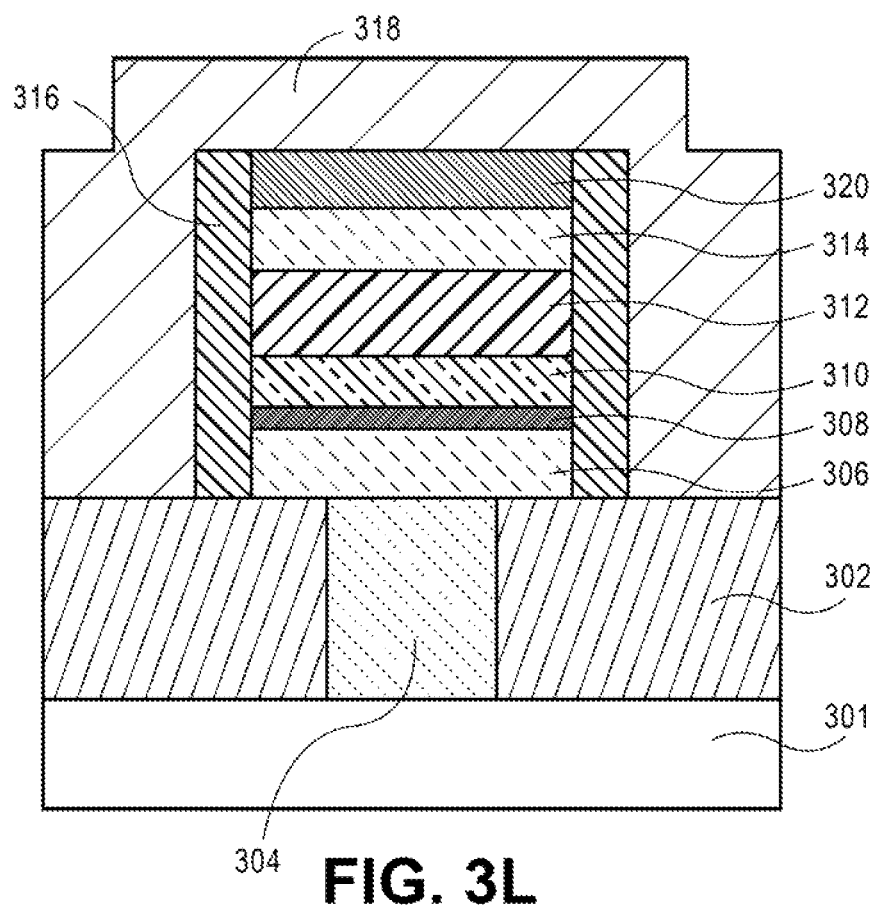

FIG. 3L illustrates the structure of FIG. 3K following formation of a second dielectric material 318 covering the dielectric hardmask layer 320, RRAM device 330 and the first dielectric layer 302. In an embodiment, the total thickness of second dielectric material 318 is in the range of 250-350 nm. Suitable materials for the second dielectric layer 318 may be the same as those described in association with the first dielectric layer 302. In an embodiment, a total thickness of the second dielectric layer 318 is approximately 2 to 2.5 times the combined height of the RRAM device 330 and the dielectric hardmask layer 320.

Figure 3M:
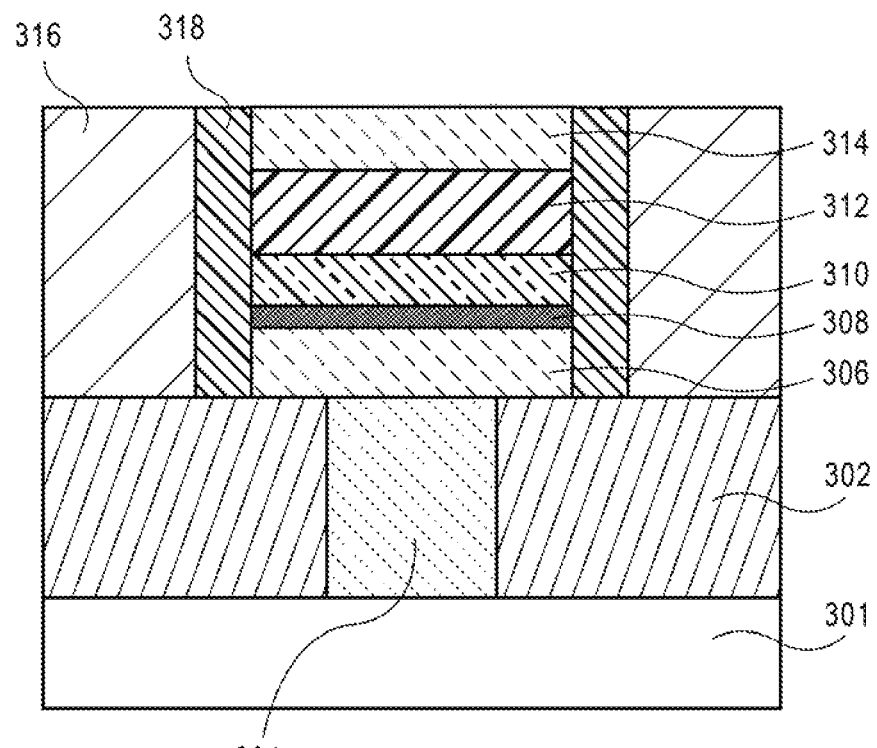

FIG. 3M illustrates the structure of FIG. 3L following planarization of the second dielectric layer 318, the dielectric spacer 316, the dielectric hardmask 320 and the top portion of the top electrode 314. In an embodiment, a chemical mechanical polishing (CMP) process is used for the planarizing. To avoid localized dishing between RRAM devices the CMP process may include multiple processes. In one embodiment, a first processing operation includes use of a first slurry to planarize the second dielectric material 318, the dielectric hardmask layer 320 and a portion of the dielectric spacer layer 316. A second, different, slurry is used to polish a portion of the top electrode 314. The resulting structure may include uppermost portions of the second dielectric layer 318, the dielectric spacer layer 316 and the top electrode 314 that are co-planar with one another.

Figure 4A:
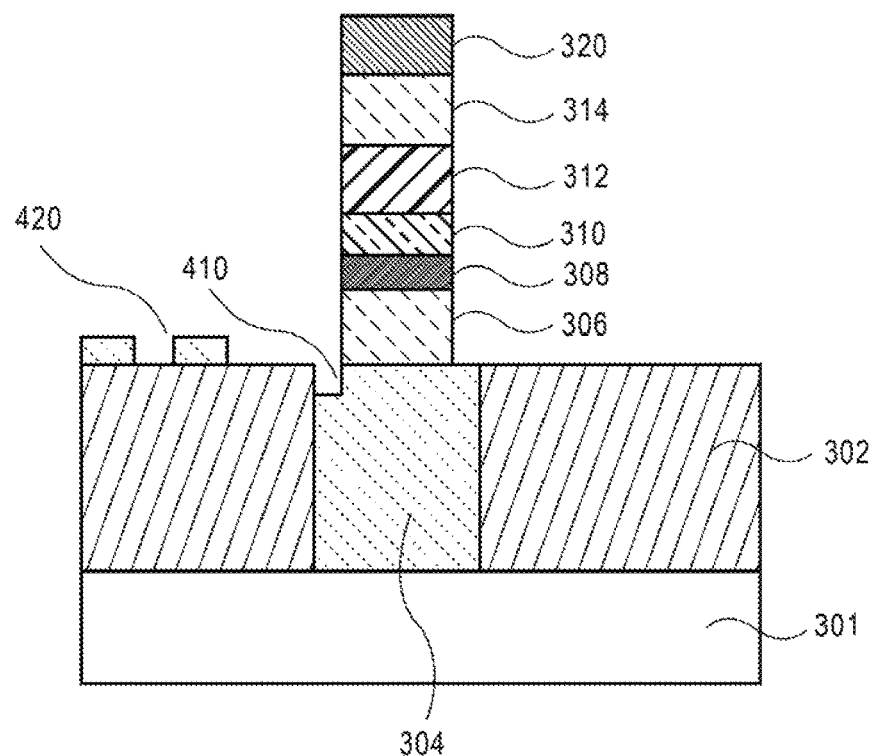
FIG. 4A illustrates a cross-sectional view representing an RRAM device where the width of a bottom electrode is smaller than the width of a conducive interconnect, in accordance with an embodiment of the present invention.

FIG. 4A illustrates a cross-sectional view representing an RRAM device where the width of a bottom electrode 306 is smaller than the width of a conducive interconnect 304, in accordance with an embodiment of the present invention. In one such embodiment, etching of the bottom electrode material 306 exposes the uppermost surface of the conductive interconnect 304. In the case that the exposed uppermost surface of the conductive interconnect 304 is an exposed copper surface, the etch may undesirably create recesses 410 and sputter copper particles 420 across the surface of the substrate.

Figure 4B:
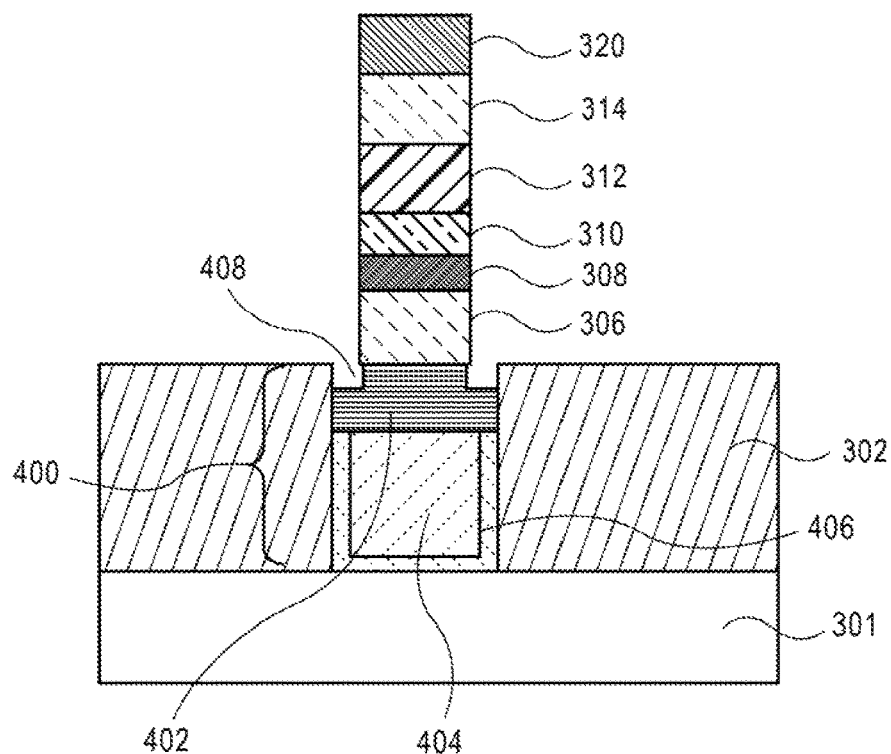
FIG. 4B illustrates a cross-sectional view representing an RRAM device where the width of a bottom electrode is smaller than the width of a conducive interconnect, and the interconnect includes a capping layer, in accordance with an embodiment of the present invention.

Accordingly, when the bottom electrode 306 is smaller than the interconnect 304, it may be desirable to utilize an interconnect having a capping layer. For example, FIG. 4B illustrates a cross-sectional view representing an RRAM device where the width of a bottom electrode is smaller than the width of a conductive interconnect 400, and the conductive interconnect 400 includes a capping layer, in accordance with an embodiment of the present invention. The conductive interconnect 400 includes capping layer 402 over a conductive fill material 404 and between a barrier layer 406. The capping layer 402 is composed of a material different than the material of the fill material 404. In one embodiment, the conductive interconnect 400 is fabricated by recessing a fill material of the conductive interconnect 304. A conductive capping material is then formed in the recess and on the uppermost surface of the first dielectric layer 302 and planarized to provide the capping layer 402. In one embodiment, the capping layer 402 is composed of a different material than the bottom electrode 306 such that the bottom electrode 306 may be selectively etched such that the capping layer 402 is not recessed during the etch. In another embodiment, the capping layer 402 is composed of the same material as the bottom electrode 306 and is recessed to form recesses 408 during the formation of the bottom electrode 306. Ideally, in one such embodiment, the capping layer 402 is sufficiently thick such that the recesses 408 do not expose an uppermost copper surface of conductive fill material 404.

Figure 5A:
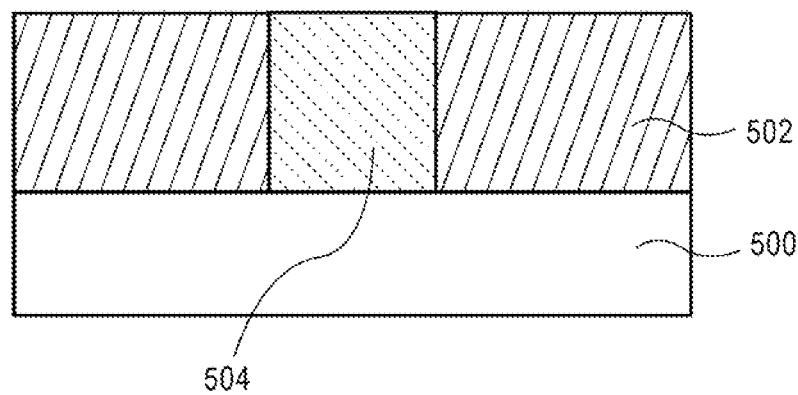
FIGS. 5A-5O illustrate cross-sectional views representing various operations in a method of fabricating a resistive random access memory device integrated on a conductive interconnect, in accordance with an embodiment of the present invention.
Figure 5B:
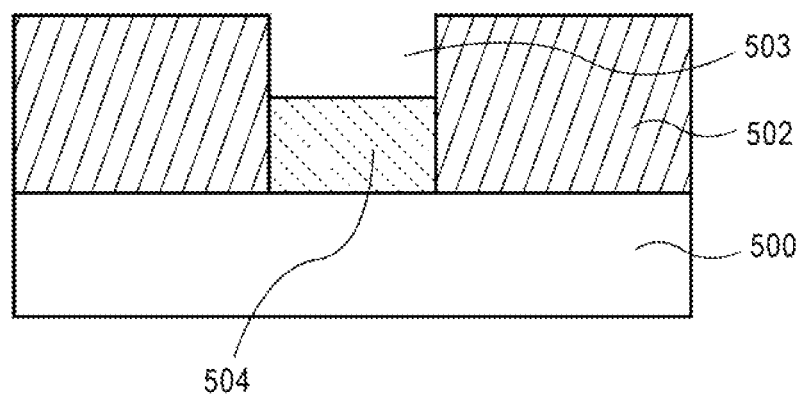
FIG. 5B illustrates the structure of FIG. 5A following recessing of the conductive interconnect to a level below an uppermost surface of the first dielectric layer.
Figure 5C:
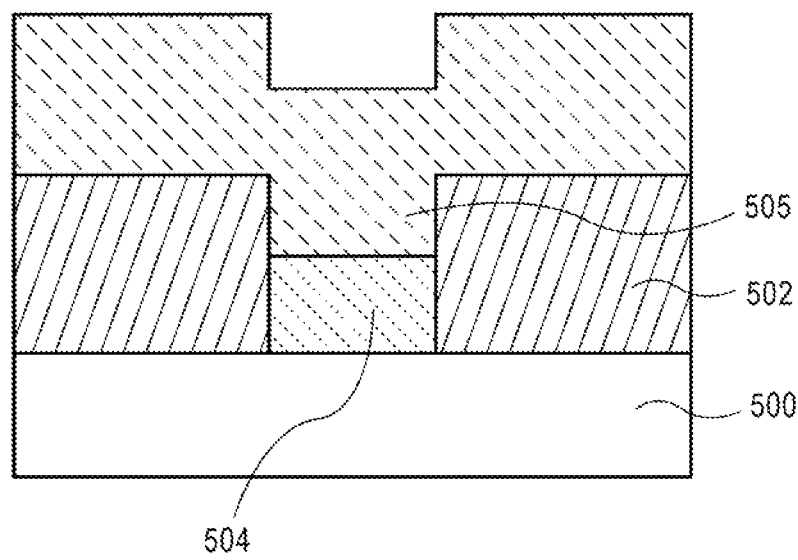
FIG. 5C illustrates the structure of FIG. 5B following formation of a bottom electrode layer on the recessed conductive interconnect and on the uppermost surface of the first dielectric layer.
Figure 5D:
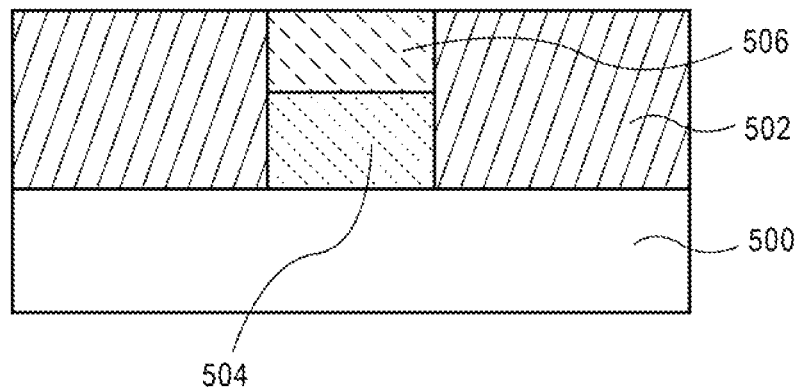
FIG. 5D illustrates the structure of FIG. 5C following planarization of the bottom electrode layer to form a bottom electrode.
Figure 5E:
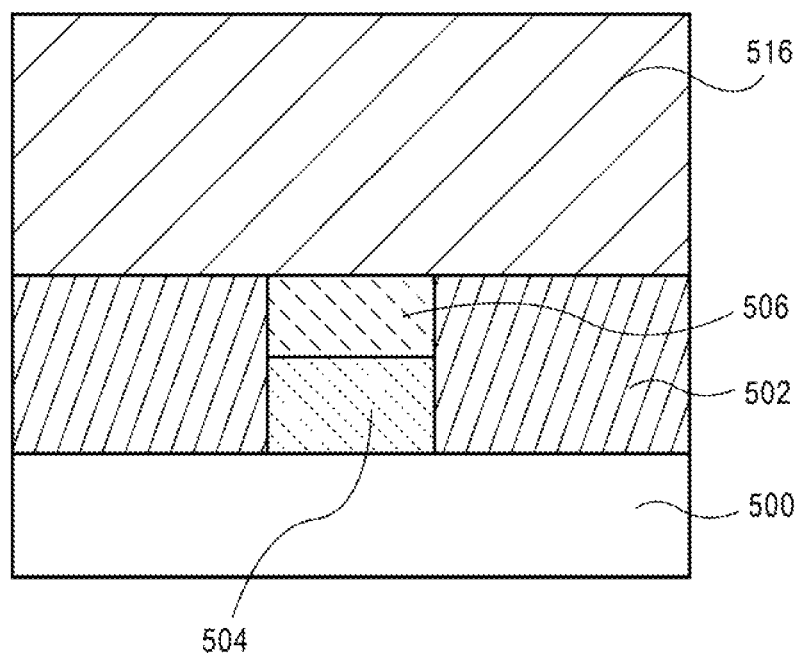
FIG. 5E illustrates the structure of FIG. 5D following formation of a second dielectric layer on an uppermost surface of the bottom electrode and on the uppermost surface of the first dielectric layer.
Figure 5F:
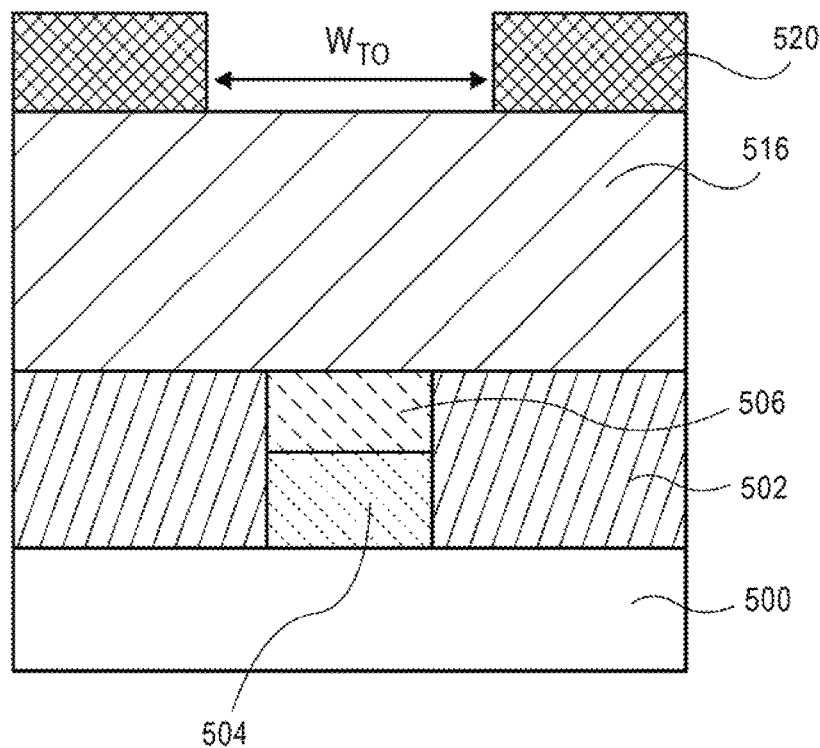
FIG. 5F illustrates the structure of FIG. 5E following patterning of a photoresist material to form a mask to define a via location.
Figure 5G:
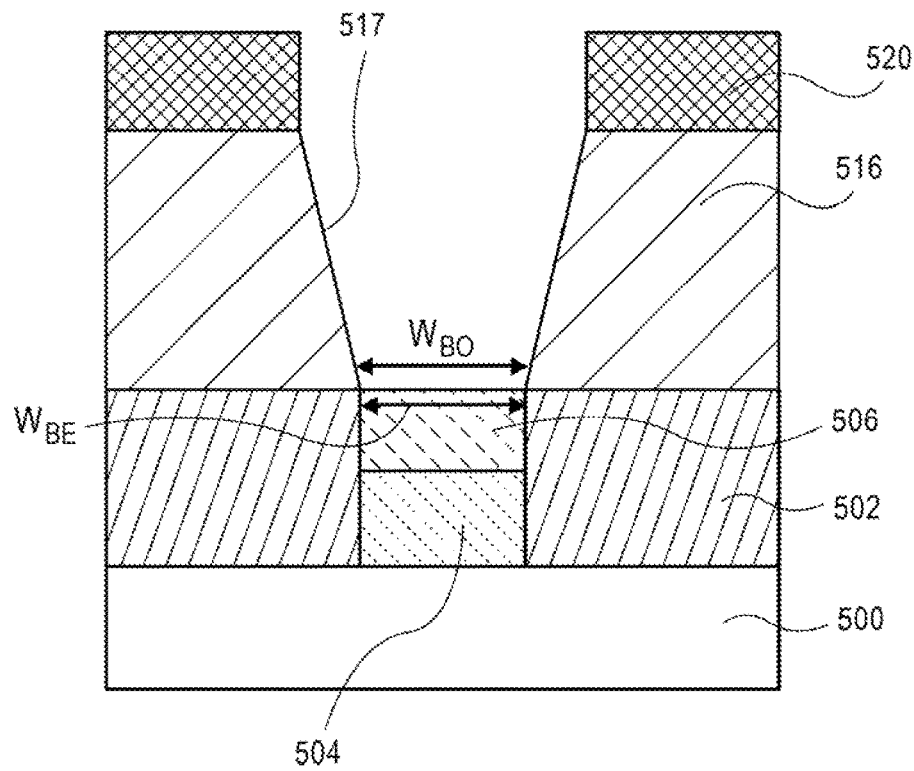
FIG. 5G illustrates the structure of FIG. 5F following an etch process to create a via in the second dielectric layer.
Figure 5H:
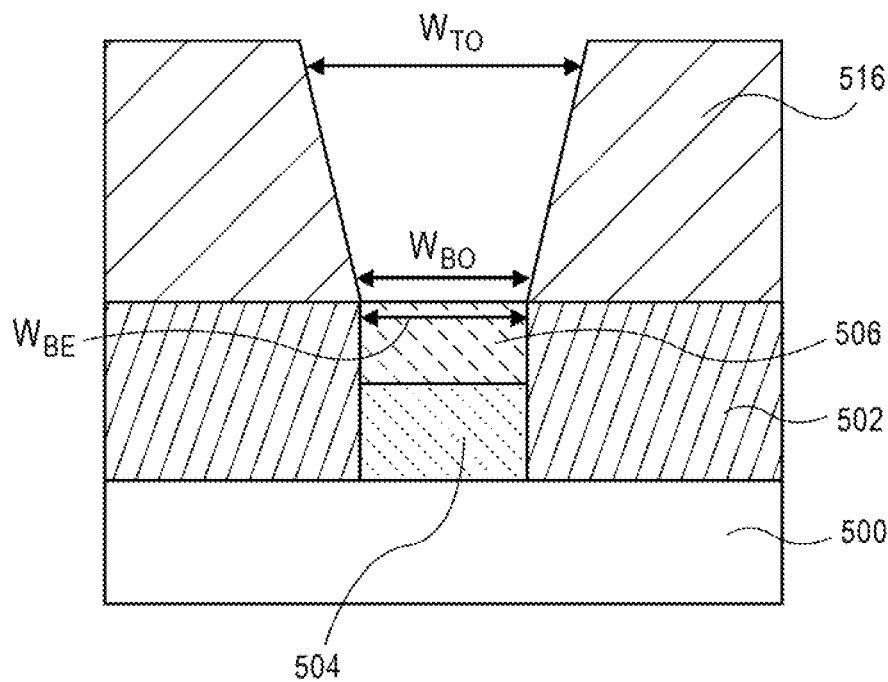
FIG. 5H illustrates the structure of FIG. 5G following removal of the mask.
Figure 5I:
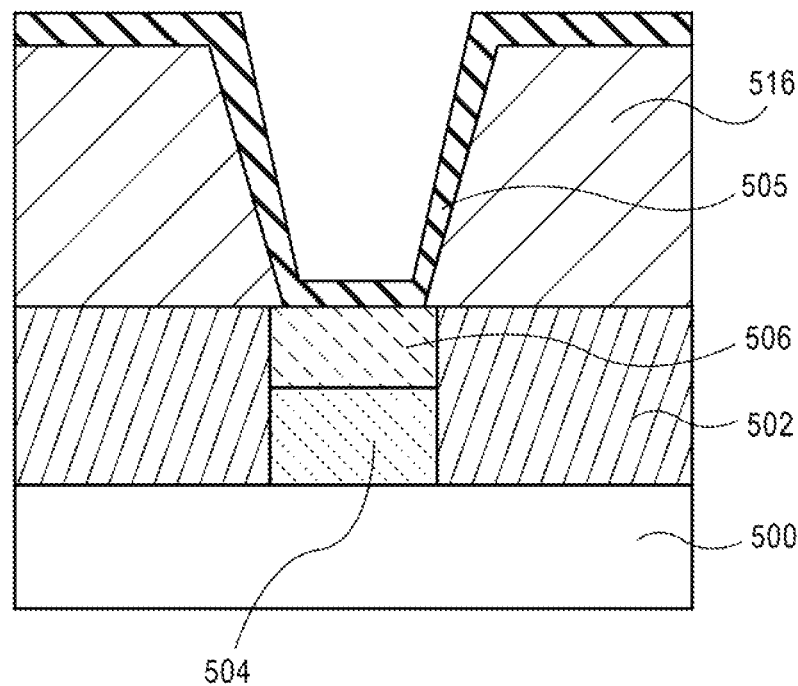
FIG. 5I illustrates the structure of FIG. 5H following formation of a conductive layer in the via and on the bottom electrode.
Figure 5J:
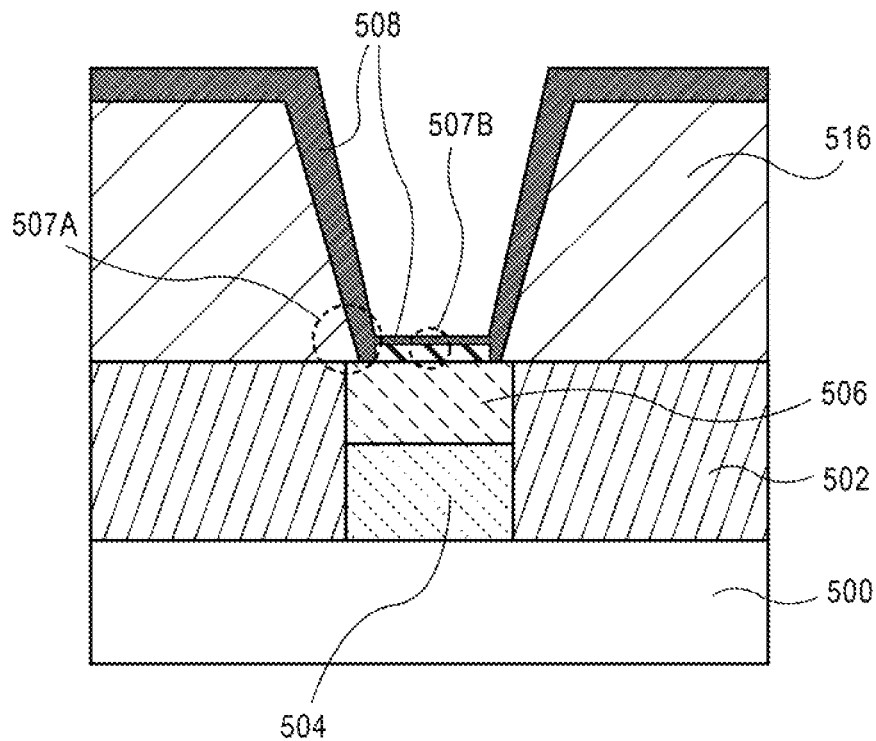
FIG. 5J illustrates the structure of FIG. 5I following a partial oxidation of the conductive layer.
Figure 5K:
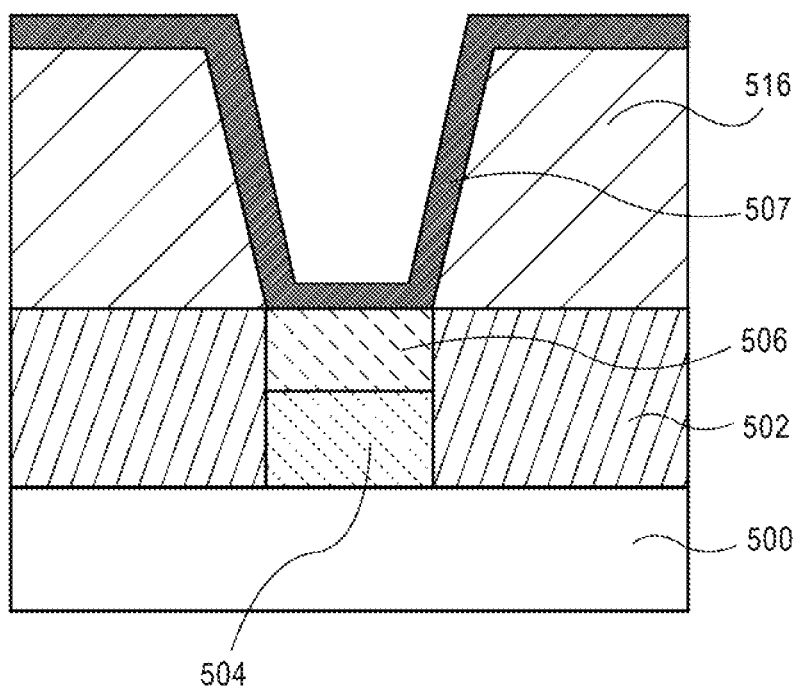
FIG. 5K illustrates the structure of FIG. 5J following a complete oxidation of the conductive layer.
Figure 5L:
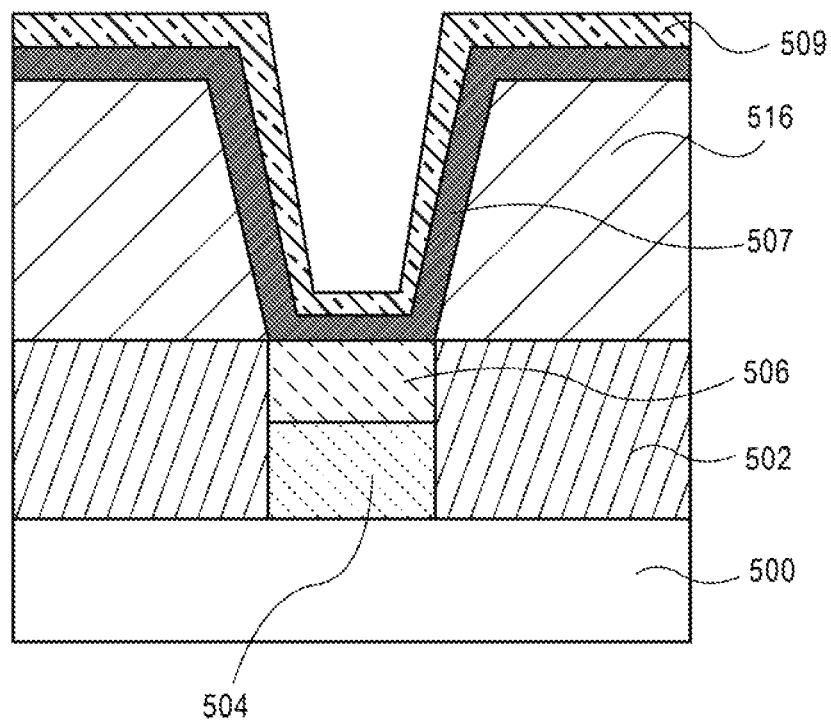
FIG. 5L illustrates the structure of FIG. 5K following formation of a metal oxide switching layer in the via and on the oxidized conductive layer.
Figure 5M:
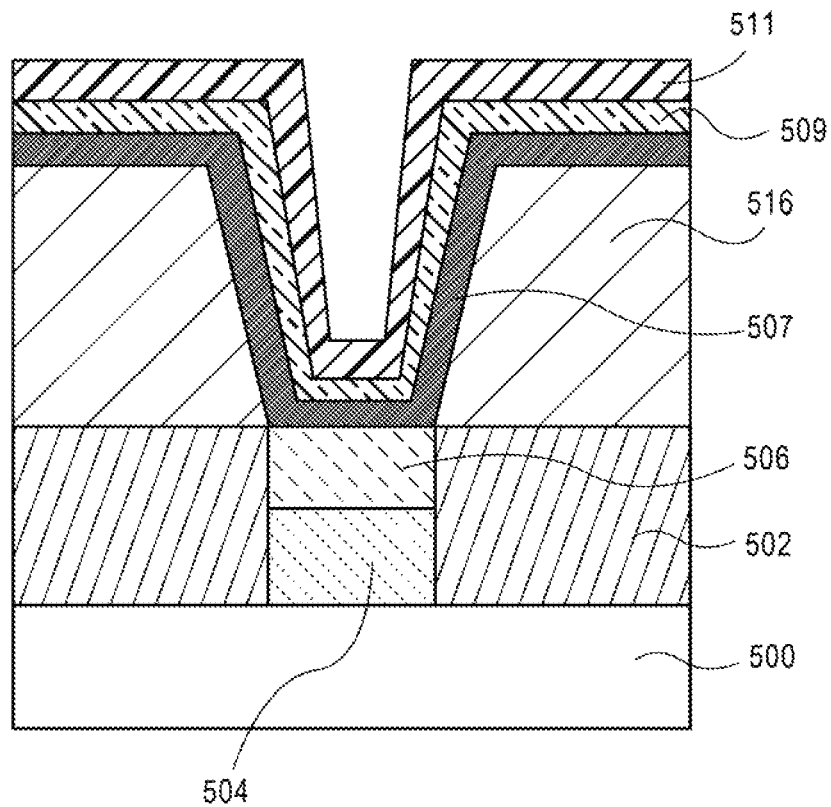
FIG. 5M illustrates the structure of FIG. 5L following formation of oxygen exchange layer in the via and on the metal oxide switching layer.
Figure 5N:
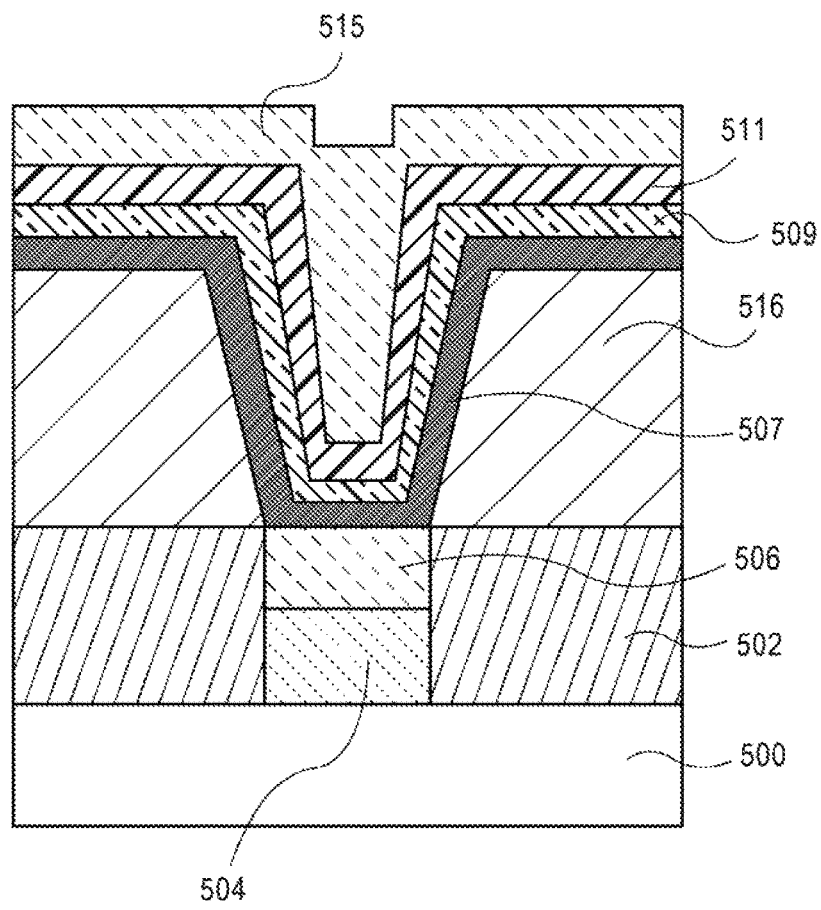
FIG. 5N illustrates the structure of FIG. 5M following formation of a top electrode metal layer in the via and on the oxygen exchange layer.
Figure 5O:
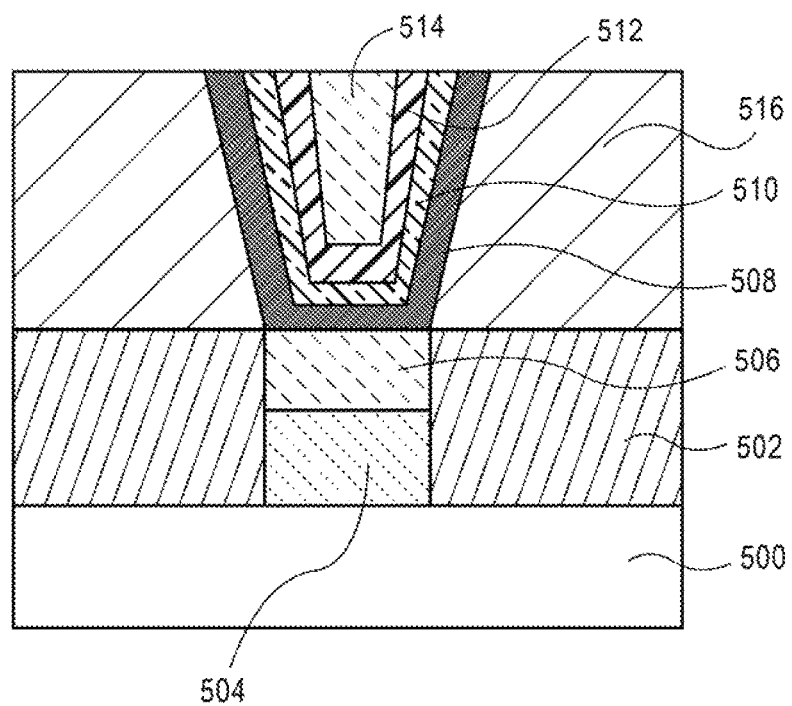

FIGS. 5A-5O illustrate cross-sectional views representing various operations in a method of fabricating a resistive random access memory device integrated on a conductive interconnect, which may be used to fabricate a memory device such as described in association with FIG. 2A, in accordance with an embodiment of the present invention.

FIG. 5A illustrates a conductive interconnect 504 formed in a first dielectric layer 502 above a substrate 500. Conductive interconnect 504 may be fabricated in a manner similar to the interconnect 304 described in association with FIG. 3A.

FIG. 5B illustrates the structure of FIG. 5A following recessing of the conductive interconnect 504 to a level below an uppermost surface of the first dielectric layer 502 to form a recess 503.

In an embodiment, the recessing is performed by a combination of a dry and a wet etch process. In an embodiment, the recess 503 has a depth approximately in the range of 30 nm-60 nm. The recessing process may or may not recess all components of the conductive interconnect 504. For example, in an embodiment, a conductive fill material is recessed and a diffusion barrier layer is not recessed and extends above the recessed conductive fill material. In another embodiment, both a conductive fill material and a diffusion barrier layer are recessed.

FIG. 5C illustrates the structure of FIG. 5B following formation of a bottom electrode material 505 on the recessed conductive interconnect 504 and on the uppermost surface of the first dielectric layer 502. Exemplary materials and deposition processes for the bottom electrode material 505 are as described above in association with bottom electrode 306.

FIG. 5D illustrates the structure of FIG. 5C following planarization of the bottom electrode material 505 to form a bottom electrode 506. In an embodiment, the bottom electrode material 505 is planarized using a CMP process. In one such embodiment, the CMP process provides the bottom electrode 506 with an uppermost surface co-planar with the uppermost surface of the ILD layer 502.

FIG. 5E illustrates the structure of FIG. 5D following formation of a second dielectric layer 516 on an uppermost surface of the bottom electrode 506 and on the uppermost surface of the first dielectric layer 502.

In an embodiment, the second dielectric layer 516 is a material such as, but not limited to, silicon nitride, carbon doped nitride and silicon carbide. In another embodiment, the second dielectric layer 516 is composed of an amorphous silicon oxynitride material. In an embodiment, the thickness of the second dielectric layer 516 is selected based on the width and height of the RRAM device to be fabricated. The thickness may be selected to account for an amount to be sacrificed during a CMP operation used at the end of an RRAM device structure fabrication process.

FIG. 5F illustrates the structure of FIG. 5E following patterning of a photoresist material to form a mask 520 to define a via location. In an embodiment, the via location is selected to ultimately expose at least a portion of the bottom electrode 506.

FIG. 5G illustrates the structure of FIG. 5F following an etch process used to create a via 517 in the second dielectric layer 516. The via 517 exposes at least a portion of the bottom electrode 506.

In an embodiment, the width of the top of the via 517 is wider than the bottom of the via. In one such embodiment the via 517 has sloped sidewalls. In an embodiment, the sloped sidewalls have an angle between 45-60 degrees with respect to a vertical axis of the via 517. In an embodiment, the width of the bottom of the via 517 is approximately the same size as the width of the bottom electrode 506. In one embodiment, a central vertical axis of the via 517 is centered with a center of the bottom electrode 506. In another embodiment, the central vertical axis of the via 517 is off-set with the center of the bottom electrode 506.

FIG. 5H illustrates the structure of FIG. 5G following removal of the mask 520. In an embodiment, the mask 520 is removed using a resist strip and cleans process. In one embodiment, the bottom electrode 506 is exposed to a plasma during the mask 520 removal. In one such embodiment, the bottom electrode 506 is subjected to a sputter clean treatment prior to deposition of a next RRAM material layer stack.

FIG. 5I illustrates the structure of FIG. 5H following formation of a conductive layer 505 in the via 517 and on the bottom electrode 506. In an embodiment, the conductive layer 505 is formed at the bottom of the via 517 on the bottom electrode 506, along the sidewalls of the via 517, and on the uppermost surface of the second dielectric layer 516. Exemplary material compositions and deposition techniques for forming the highly conductive layer 505 may be as described above for the conductive layer 308.

FIG. 5J illustrates the structure of FIG. 5I following a partial oxidation of the conductive layer 505. Methods for forming a partially oxidized conductive layer 507 may be as described as above for partially oxidized conductive layer 307. In particular, following a partial oxidation of the conductive layer 505 forms a partially oxidized conductive layer 507 composed of an oxidized material 508 and a conductive layer 505.

In one embodiment, portions of the conductive layer 505 disposed on the sidewall adjacent to the dielectric layer 516 are oxidized as a result of being in contact with an oxygen-including second dielectric layer 516. In an embodiment, the upper portion of the conductive layer disposed on the bottom electrode 506 also becomes oxidized while the portion in direct contact with the bottom electrode 506 remains conductive, as is depicted in FIG. 5J. That is, sidewall portions 507A of the partially oxidized conductive layer 507 are fully oxidized. The portion 507B of the partially oxidized conductive layer 507 that is on the bottom electrode 506 includes a lower conductive portion 505 and an upper oxidized portion 508. Examples of such techniques may involve air exposure post formation of the conductive layer 505 or a combination of air exposure post conductive layer deposition and a furnace anneal at the end of RRAM fabrication. In an embodiment, the furnace annealing is performed at a temperature approximately in the range of 250-300 degree Celsius.

FIG. 5K illustrates the structure of FIG. 5J following a complete oxidation of the conductive layer 505. In an embodiment, the entire conductive layer 505 is fully oxidized leading to formation of a fully oxidized conductive layer 508. Methods for oxidation of the conductive layer 305 are described above in association with the formation of the fully oxidized conductive layer 308 and below in association with FIGS. 7A-7D.

FIG. 5L illustrates the structure of FIG. 5K following formation of a metal oxide switching material 511 in the via 517 and on the conductive layer 507. In an embodiment, the metal oxide switching material 509 is formed at the bottom of the via 517 on the bottom electrode 506, along the sidewalls of the via 517, and on the uppermost surface of the second dielectric layer 516. Exemplary material compositions and deposition techniques for forming the metal oxide switching material 509 may be as described above for the metal oxide switching layer 310. In an embodiment, metal oxide switching material 511 is formed on the conductive layer 508 using a PVD process without breaking vacuum.

FIG. 5M illustrates the structure of FIG. 5L following formation of an oxygen exchange material 511 in the via 517, on the metal oxide switching material 509 and along the sidewalls of the via 517. It is to be appreciated that the RRAM device size may be determined by the overlap between the oxygen exchange material 511 and the bottom electrode 506. In an embodiment, the oxygen exchange material 511 is formed at the bottom of the via 517 on the metal oxide switching material 509, along the sidewalls of the via 517, and on the uppermost surface of the second dielectric layer 516. In an embodiment, the oxygen exchange material 511 has a thickness on the sidewalls that is less that the thickness on the bottom of the opening. Exemplary material compositions and deposition techniques for forming the extended oxygen exchange material 511 may be as described above for the oxygen exchange material 312.

FIG. 5N illustrates the structure of FIG. 5M following formation of a top electrode layer 515 in the via 517 and on the metal oxide switching material 511. In an embodiment, the top electrode layer 515 completely fills the via 517 and extends over the uppermost surface of the second dielectric layer 516. Exemplary material compositions and deposition techniques for forming the top electrode layer 515 may be as described above for the top electrode layer 314. In an embodiment, the top electrode layer 515 is formed using a PVD process. In an embodiment, the top electrode layer 515 and the oxygen exchange material 511 are deposited sequentially in a same chamber or in a same tool without breaking vacuum. By doing so, the oxygen exchange material 511 does not become oxidized. In an embodiment the top electrode layer 515 has a same composition as the bottom electrode 506.

FIG. 5M illustrates the structure of FIG. 5L following a planarization process to form a top electrode 514, an oxygen exchange layer 512, a metal oxide switching layer 510, and a conductive layer 508. In an embodiment, the planarization process is a CMP process. In one such embodiment, the CMP process provides the top electrode 514, the oxygen exchange layer 512, the metal oxide switching layer 510, and the conductive layer 508 with uppermost surfaces co-planar with the uppermost surface of the second dielectric layer 516.

FIGS. 6A-6E illustrate cross-sectional views representing various operations in a method of fabricating a bottom electrode 606 integrated on a conductive interconnect 604, in accordance with an embodiment of the present invention.

Figure 6A:
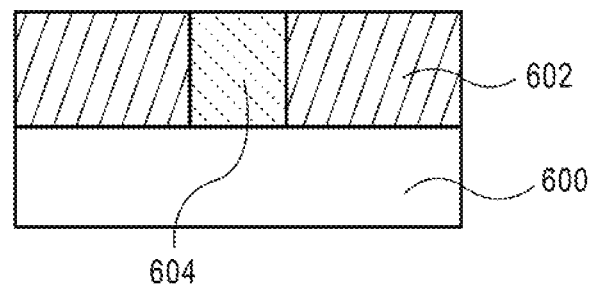
FIGS. 6A-6E illustrate cross-sectional views representing various operations in a method of fabricating a bottom electrode integrated on a conductive interconnect, in accordance with an embodiment of the present invention.

FIG. 6A illustrates a conductive interconnect 604 formed in an opening in a first dielectric layer 602 above a substrate 600.

Figure 6B:
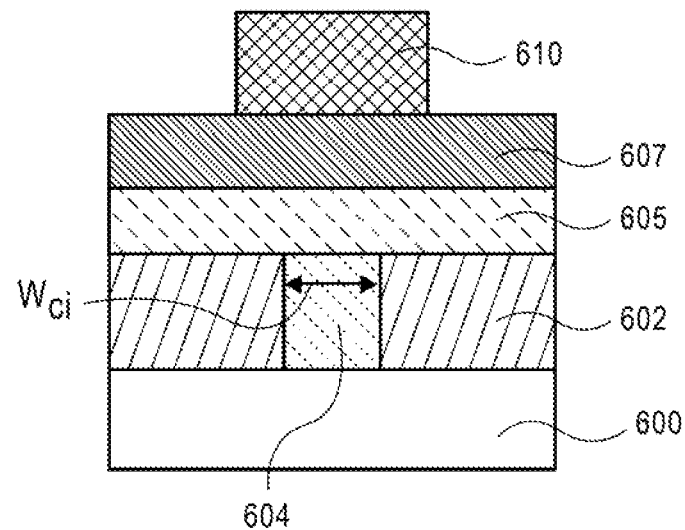

FIG. 6B illustrates the structure of FIG. 6A following the formation of a material layer stack including of a resist pattern 610, a dielectric hardmask layer 607 and a bottom electrode material 605 formed on the conductive interconnect 604 and on the first dielectric layer 602. In an embodiment, the bottom electrode material 605, the dielectric hardmask layer 607 and resist pattern 610 have compositions and thicknesses such as described above in association with the bottom electrode material 306, the dielectric hardmask layer 607 and resist pattern 316, respectively. In an embodiment, the resist pattern 610 has a width, $W_r$, that is greater than the width, $W_{ci}$, of the conductive interconnect 604. In another embodiment, the resist pattern 610 has a width, $W_r$, that is less than the width, $W_{ci}$, of the conductive interconnect 604.

Figure 6C:
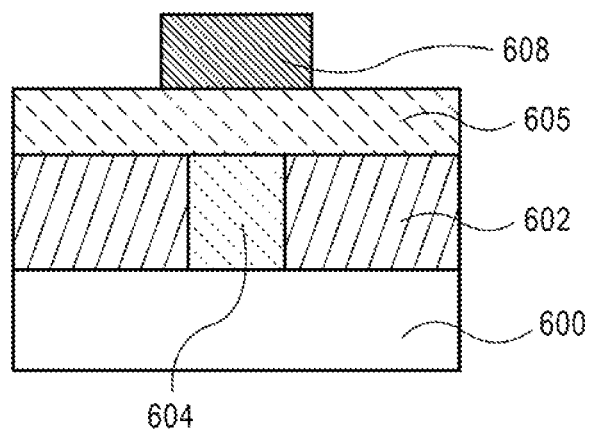

FIG. 6C illustrates the structure of FIG. 6B following an etch process used to transfer the resist pattern 610 into the dielectric hardmask layer 607 to form a dielectric hardmask layer 608. In an embodiment, the resist pattern 610 is subsequently removed by a resist strip process.

Figure 6D:
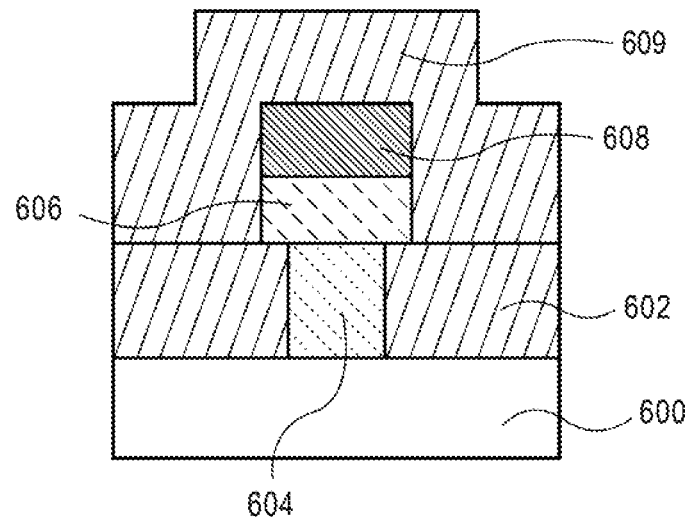

FIG. 6D illustrates the structure of FIG. 6C following an etch process used to transfer the pattern of the dielectric hardmask layer 608 into the bottom electrode material 605 to form a bottom electrode 606. Subsequently, a second dielectric layer 609 is formed and covers the top and the sidewalls of the dielectric hardmask layer 608, the sidewalls of the bottom electrode 606 and an uppermost surface of the first dielectric layer 602.

Figure 6E:
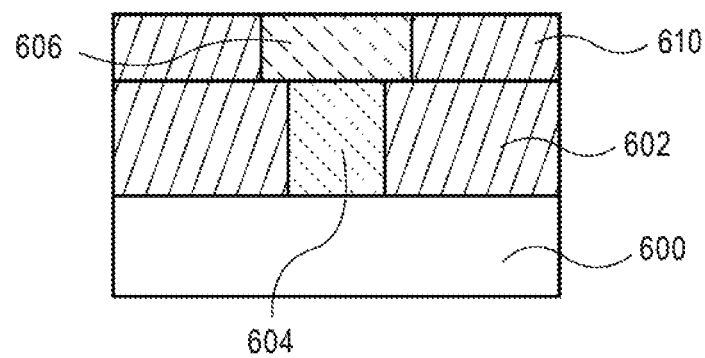

FIG. 6E illustrates the structure of FIG. 6D following planarization of dielectric hardmask layer 608, a top portion of the bottom electrode 606 and the second dielectric layer 609. In an embodiment, an uppermost surface of the bottom electrode 606 and the second dielectric layer 610 are coplanar or substantially coplanar subsequent to planarization.

FIGS. 7A-7D illustrate cross-sectional views representing a summary of schemes for oxidizing a conductive layer formed between a lower electrode and an upper metal oxide switching layer.

Figure 7A:
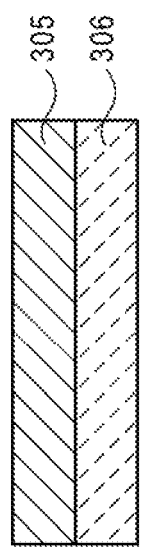
FIGS. 7A-7D illustrate cross-sectional views representing a summary of schemes for oxidizing the conductive layer.

FIG. 7A illustrates the formation of a conductive layer 305 on a bottom electrode material 306.

Figure 7B:
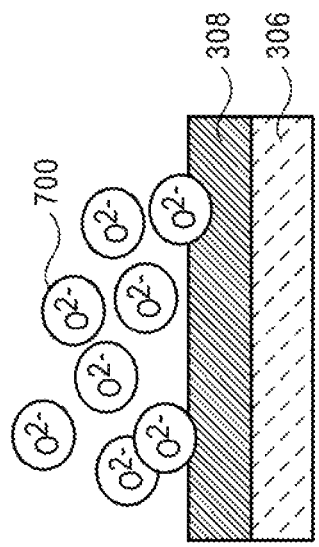

FIG. 7B illustrates the structure of FIG. 7A, where the conductive layer 307 becomes a conductive layer 308 after being subjected to an oxidation process. In an embodiment, the conductive layer 305 is oxidized by a plasma oxidation process, through exposure to oxygen ions, which are generated either remotely or locally. In one such embodiment, the oxidation process is performed in a dry etch/pre-clean chamber where the reactive energy of the $O^{2-}$ ions, 700, range from 0.01 eV-0.1 eV. At such energies, $O^{2-}$ ions 700 may not undergo reactive sputtering with the conductive layer 308 but instead combine with the atoms in the metal to form a metal oxide.

In an embodiment, an oxidation process is carried out by air exposure. In one such embodiment, conductive layer 305 is removed from a deposition chamber in which the conductive layer 305 is formed and exposed to an environment containing $O_2/N_2$ in a chamber with pressure approximately in the range of $10^{-1}$ Torr to $10^{-3}$ Torr.

Figure 7C:
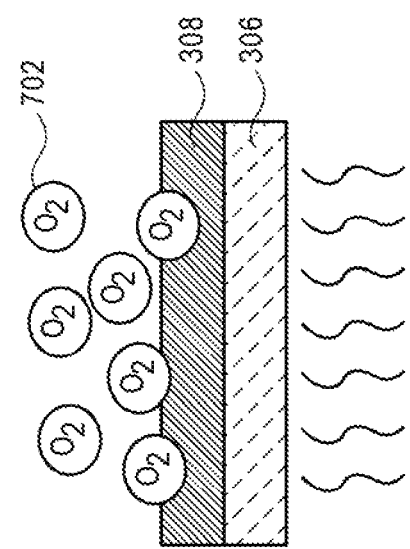

In another embodiment, as illustrated in FIG. 7C, the conductive layer 305 is oxidized through substrate heating during simultaneous exposure to a gas 702 containing $O_2$. In an embodiment, a substrate is heated to over 250 degrees Celsius to provide a fast and controlled rate of oxidation.

Figure 7D:
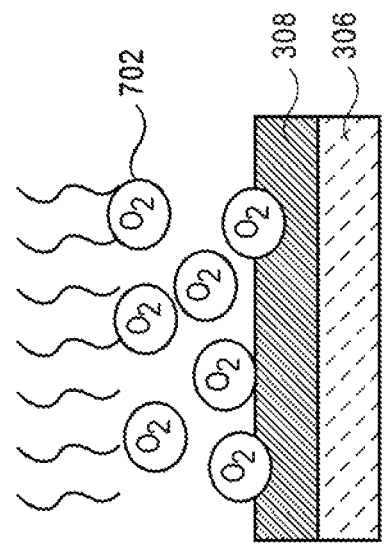

In an embodiment, as illustrated in FIG. 7D, the conductive layer 305 is heated in a furnace in the presence of an $O_2$ containing gas 702. In one such embodiment, the heating is performed at a temperature of approximately 400 degrees Celsius.

In accordance with embodiments of the present invention, a conductive layer is included in an RRAM material stack. In one embodiment, the conductive layer serves to prevent energetic $O_2$ bombardment on the bottom electrode surface 306. In one embodiment, the conductive layer is fully oxidized to form an oxidized conductive layer. In another embodiment, the conductive layer is only partially oxidized, and as such a portion of the conductive layer remains in the final RRAM device.

Figure 12:
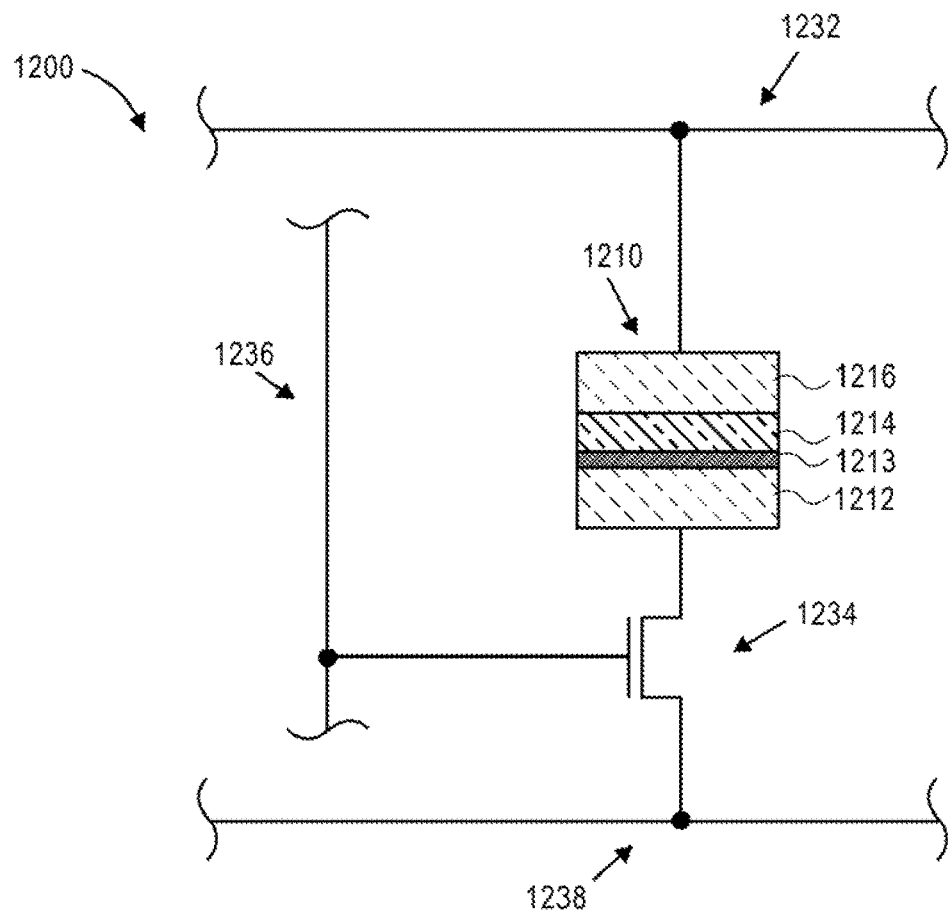
FIG. 12 illustrates a schematic of a memory bit cell which includes a metal-conductive oxide-metal RRAM device, in accordance with embodiments of the present invention.

In an embodiment after completion of an RRAM device fabrication process RRAM devices, presented in connection with FIGS. 1A and 2A, are connected to form a two terminal device such as is illustrated in FIG. 12. RRAM devices such as shown in FIG. 1A and FIG. 2A undergo a high temperature anneal process at the end of the fabrication process. In an embodiment, anneal temperatures reach 400° C. and last for a time period of 60 minutes. Annealing is a thermal phenomenon that serves to drive the $O^{2-}$ from the metal oxide switching layer thus creating Oxygen vacancies, $V_o$ in this layer. The $O^{2-}$ from the metal oxide switching layer diffuses to the oxygen exchange layer above. The effect serves to increase the $V_o$ density in the metal oxide switching layer 110 layer priming it for creation of one more conductive filaments.

Figure 9:
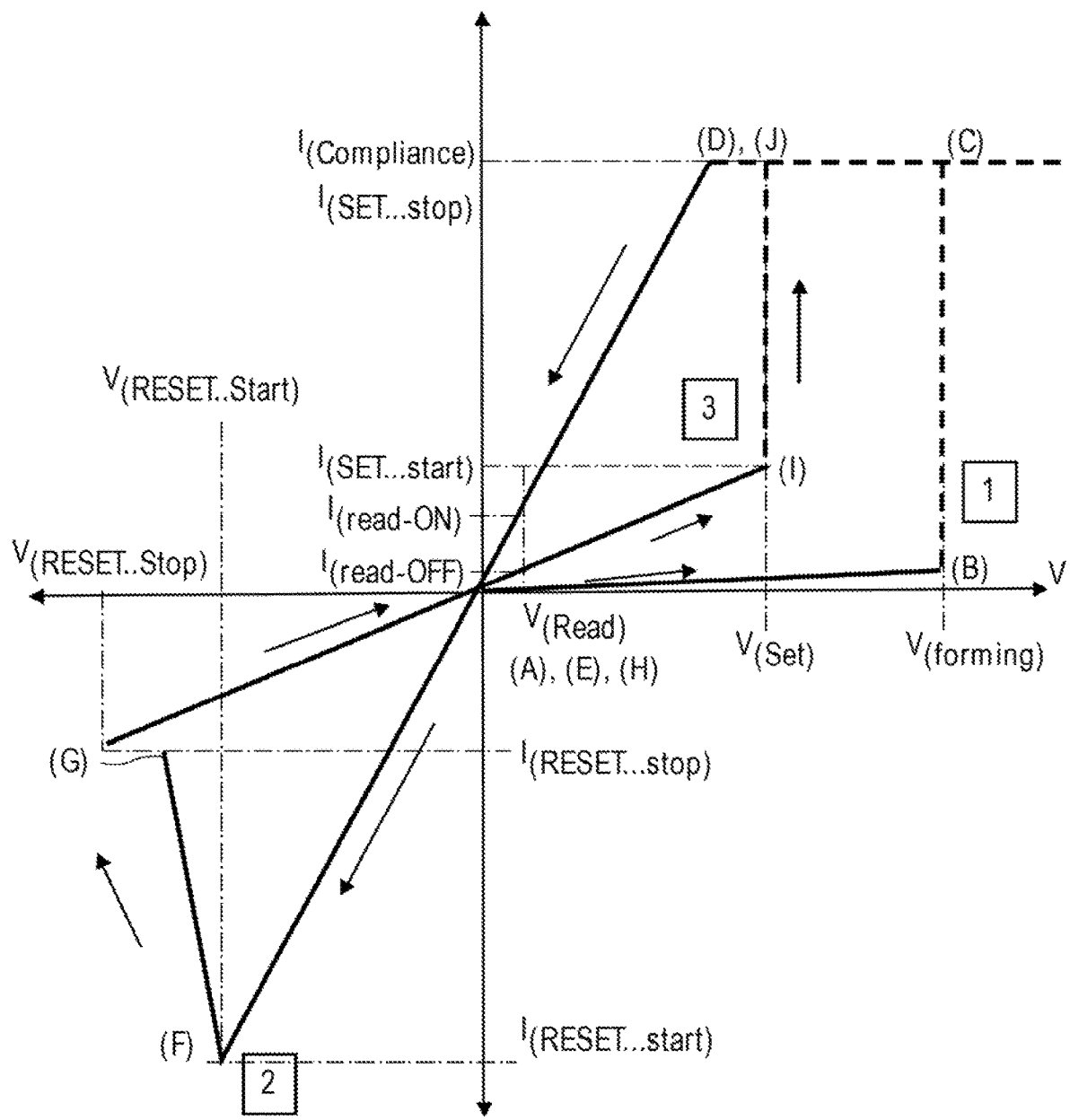
FIG. 9 illustrates an I-V plot, demonstrating concepts involved with filament formation and voltage cycling (reading and writing) in an RRAM device, in accordance with embodiments of the present invention.

FIG. 9 illustrates an I-V plot, demonstrating concepts involved with filament formation and voltage cycling (reading and writing) in an RRAM device, in accordance with embodiments of the present invention. FIG. 9 illustrates an I-V plot, demonstrating concepts involved with filament formation and voltage cycling (reading and writing) in an RRAM device, such as is depicted in FIG. 1B, in accordance with embodiments of the present invention. The initial operation of an RRAM device begins by gradually applying a voltage that is increasing in magnitude, between the top electrode 114 and the bottom electrode 106. In an "intentional" one-time breakdown process, known as forming, oxygen vacancies, $V_o$, are pumped in from the oxygen exchange layer 112 into the metal oxide switching layer 110 and the oxidized conductive layer 108 to augment the vacancies created during the anneal process described above. This leads to a formation of a "conductive" $V_o$ filament in the metal oxide switching layer 110 (point B). With a conductive filament bridging the top electrode 114 and the bottom electrode 106, the RRAM device is said to be almost immediately conductive and thus, in a low resistance state (point C). By sweeping the voltage between the top electrode 114 and bottom electrode 106 in a reversed direction (point C to D and then to F), causing a reversal in an electric field direction, the oxygen vacancies (technically positively charged ions) are now directed towards the oxygen exchange layer 112 leading to a dissolution of the conductive filament in the metal oxide switching layer 110. Filament dissolution takes place at some critical voltage (point F), termed $V_{Reset}$, and the device returns to a high resistance state (point G). It is to be appreciated that the high resistance level of the RRAM device, point G, is different and lower in magnitude compared to the resistance level of the device before the onset of the forming process. By once again "sweeping" the voltage in the opposite direction, traversing from point G to H and then to point I in the I-V plot, the momentarily dissolved filament begins to manifests again under the action of vacancy migration. At some critical voltage, $V_{set}$, the filament completely bridges the top electrode 114 and the bottom electrode 106 and the device is once again said to be in a conductive mode or a low resistance state, point J. The cycling of an RRAM device in this manner, where the resistance levels remain unchanged about the 0 voltage point, leads to the effect of non-volatile memory. In other words, even with the voltage turned off, the resistance of the RRAM device is maintained to within a certain range. In an embodiment, when an RRAM device undergoes a read operation where a voltage, less than the switching voltage ($V_{set}$ or $V_{Reset}$) is applied, the device exhibits a numerical resistance value approximately similar in value before the voltage is turned off. It is to be appreciated that the values $V_{set}$ and $V_{Reset}$ generally refer to a portion of a voltage that is applied to a transistor in series with the RRAM element. The RRAM device coupled with a transistor in this manner is given the term embedded memory.

Figure 10:
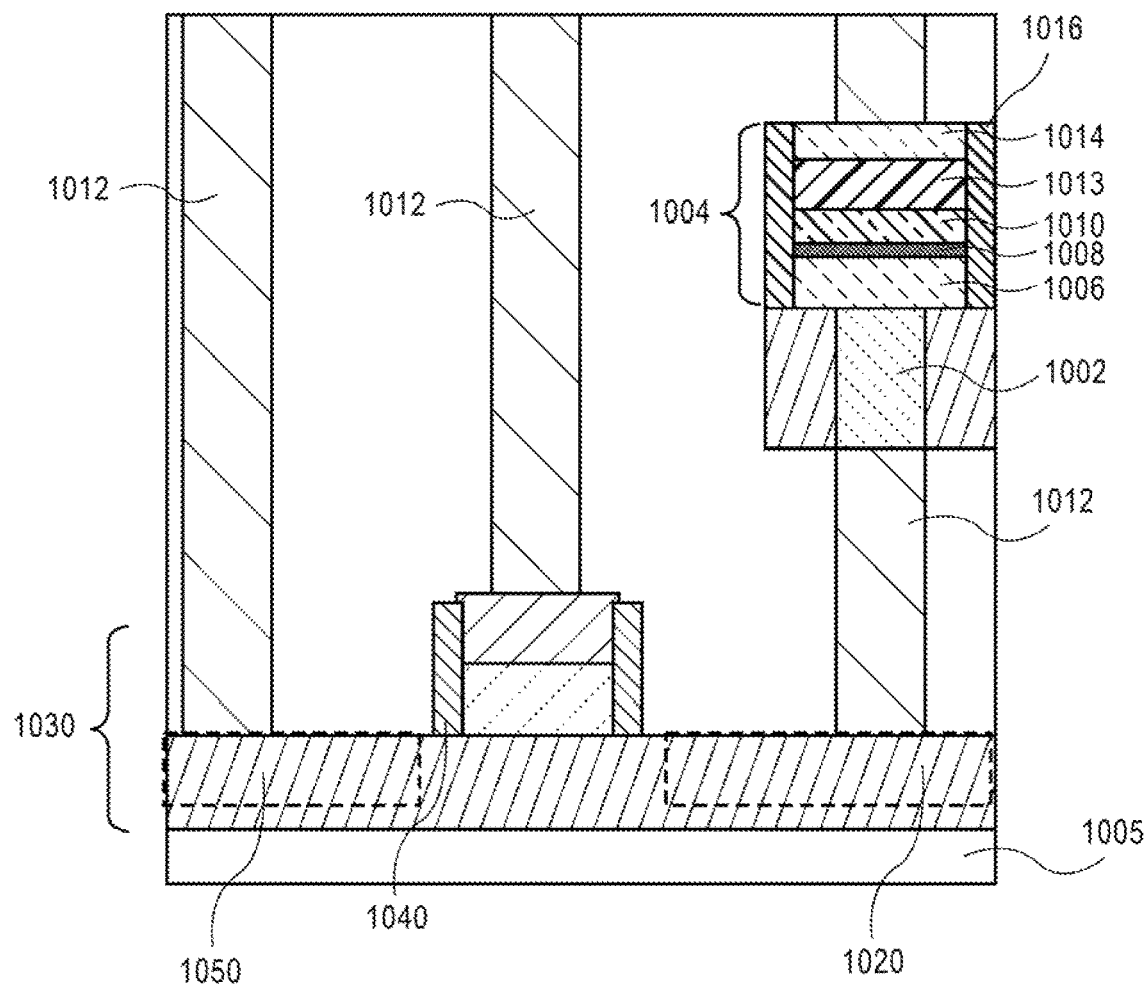
FIG. 10 illustrates a cross-sectional view of an RRAM element coupled to a drain side of a select transistor, in accordance with an embodiment of the present invention.

FIG. 10 illustrates a RRAM device 1004, formed on a conductive interconnect 1002 disposed in a via and integrated with a logic transistor 1030 disposed above a substrate 1005. RRAM device 1004 includes a bottom electrode 1006, an oxidized conductive layer 1008, a metal oxide switching layer 1010, an oxygen exchange layer 1013 and a top electrode 1014. The RRAM device is surrounded by a dielectric spacer 1016. In one such embodiment, the RRAM device 1004 is a device such as described in association with FIG. 1A. In one such embodiment, the RRAM device is disposed directly on a conductive interconnect coupled to a contact structure 1012 connected to the drain end 1020 of the transistor. In other embodiments, the RRAM device 1004 is a device such as described in association with FIG. 1B.

In an embodiment, the underlying semiconductor substrate 1005 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The substrate may also include semiconductor materials, metals, dielectrics, dopants, and other materials commonly found in semiconductor substrates.

In an embodiment, transistors associated with substrate 1005 are metal-oxide-semiconductor field-effect transistors (MOSFET or simply MOS transistors), fabricated on the substrate 1005. In various implementations of the invention, the MOS transistors may be planar transistors, nonplanar transistors, or a combination of both. Nonplanar transistors include Fin-FET transistors such as double-gate transistors and tri-gate transistors, and wrap-around or all-around gate transistors such as nanoribbon and nanowire transistors.

In an embodiment, each MOS transistor 1030 of substrate 1005 includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor of substrate 1005 is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a conductive fill layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers 1040 may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source 1050 and drain 1020 regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxial deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

To provide further context, integrating memory directly onto a microprocessor chip would be advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. As such, embedding charge-based memory directly onto a high performance logic chip is not very attractive for future technology nodes. However, a memory technology that does have the potential to scale to much smaller geometries compared to traditional charge-based memories is resistive random access memory (RRAM), since it relies on resistivity rather than charge as the information carrier. However, in order to exploit the potential benefits of a high performance logic chip with embedded RRAM memory, an appropriate integrated logic plus RRAM structure and fabrication method is needed. Embodiments of the present invention include such structures and fabrication processes.

Relating to one or more embodiments described herein, it is to be appreciated that traditional DRAM memory is facing severe scaling issues and, so, other types of memory devices are being actively explored in the electronics industry. One future contender is RRAM devices. Embodiments described herein include a fabrication method for embedding RRAM bit cell arrays into a logic process technology. Embodiments described may be advantageous for processing schemes involving the fabrication of logic processors with embedded memory arrays.

In an aspect, an RRAM element may be included in an integrated circuit in regions typically referred to as back end or back end of line (BEOL) layers of the integrated circuit. As examples, FIGS. 11A-11E illustrate schematic views of several options for positioning an RRAM element in an integrated circuit, in accordance with embodiments of the present invention.

Referring to all FIGS. 11A-11E, in each case, a memory region 1100 and a logic region 1102 of an integrated circuit are depicted schematically. Each memory region 1100 includes a select transistor 1104 and overlying alternating metal lines and vias. Each logic region includes a plurality of transistors 1106 and overlying alternating metal lines and vias which can be used to connect the plurality of transistors 1106 into functional circuits, as is well known in the art.

Referring to FIG. 11A, an RRAM device 1120 is disposed between a lower conductive via 1122 and an upper conductive line 1124. In one embodiment, the lower conductive via 1122 is in electrical contact with a bottom electrode of the RRAM device 1120, and the upper conductive line 1124 is in electrical contact with a top electrode of the RRAM device 1120. In a specific embodiment, the lower conductive via 1122 is in direct contact with a bottom electrode of the RRAM device 1120, and the upper conductive line 1124 is in direct contact with a top electrode of the RRAM device 1120.

Referring to FIG. 11B, an RRAM device 1130 is disposed between a lower conductive line 1132 and an upper conductive via 1134. In one embodiment, the lower conductive line 1132 is in electrical contact with a bottom electrode of the RRAM device 1130, and the upper conductive via 1134 is in electrical contact with a top electrode of the RRAM device 1130. In a specific embodiment, the lower conductive line 1132 is in direct contact with a bottom electrode of the RRAM device 1130, and the upper conductive via 1134 is in direct contact with a top electrode of the RRAM device 1130.

Referring to FIG. 11C, an RRAM device 1140 is disposed between a lower conductive line 1142 and an upper conductive line 1144 without an intervening conductive via. In one embodiment, the lower conductive line 1142 is in electrical contact with a bottom electrode of the RRAM device 1140, and the upper conductive line 1144 is in electrical contact with a top electrode of the RRAM device 1140. In a specific embodiment, the lower conductive line 1142 is in direct contact with a bottom electrode of the RRAM device 1140, and the upper conductive line 1144 is in direct contact with a top electrode of the RRAM device 1140.

Referring to FIG. 11D, an RRAM device 1150 is disposed between a lower conductive via 1152 and an upper conductive via 1154 without an intervening conductive line. In one embodiment, the lower conductive via 1152 is in electrical contact with a bottom electrode of the RRAM device 1150, and the upper conductive via 1154 is in electrical contact with a top electrode of the RRAM device 1150. In a specific embodiment, the lower conductive via 1152 is in direct contact with a bottom electrode of the RRAM device 1150, and the upper conductive via 1154 is in direct contact with a top electrode of the RRAM device 1150.

Referring to FIG. 11E, an RRAM device 1160 is disposed between a lower conductive line 1162 and an upper conductive via 1164 in place of an intervening conductive line and conductive via pairing. In one embodiment, the lower conductive line 1162 is in electrical contact with a bottom electrode of the RRAM device 1160, and the upper conductive via 1164 is in electrical contact with a top electrode of the RRAM device 1160. In a specific embodiment, the lower conductive line 1162 is in direct contact with a bottom electrode of the RRAM device 1160, and the upper conductive via 1164 is in direct contact with a top electrode of the RRAM device 1160.

FIG. 12 illustrates a schematic of a memory bit cell, which includes a metal-conductive oxide-metal RRAM device, in accordance with embodiments of the present invention.

Referring to FIG. 12, the RRAM memory device 1210 may include a bottom electrode 1212 with an extended metal oxide switching layer 1213 formed on the bottom electrode 1212. An oxygen exchange layer 1214 is formed on the extended metal oxide switching layer 1213. A top electrode 1216 is formed on the oxygen exchange layer 1214. The top electrode 1216 may be electrically connected to a bit line 1232. The bottom electrode 1212 may be coupled with a transistor 1234. The transistor 1234 may be coupled with a wordline 1236 and a source line 1238 in a manner that will be understood to those skilled in the art. The RRAM cell 1200 may further include additional read and write circuitry (not shown), a sense amplifier (not shown), a bit line reference (not shown), and the like, as will be understood by those skilled in the art, for the operation of the RRAM cell 1200. It is to be appreciated that a plurality of the RRAM cells 1200 may be operably connected to one another to form a memory array, wherein the memory array can be incorporated into a non-volatile memory region of a substrate in common with a logic region. It is to be appreciated that the nomenclature top and bottom refer to relative positioning of the metal electrodes with respect to the metal oxide layer. The transistor 1234 may be connected to top electrode 1216 although only connection to bottom electrode 1212 is shown.

Figure 13:
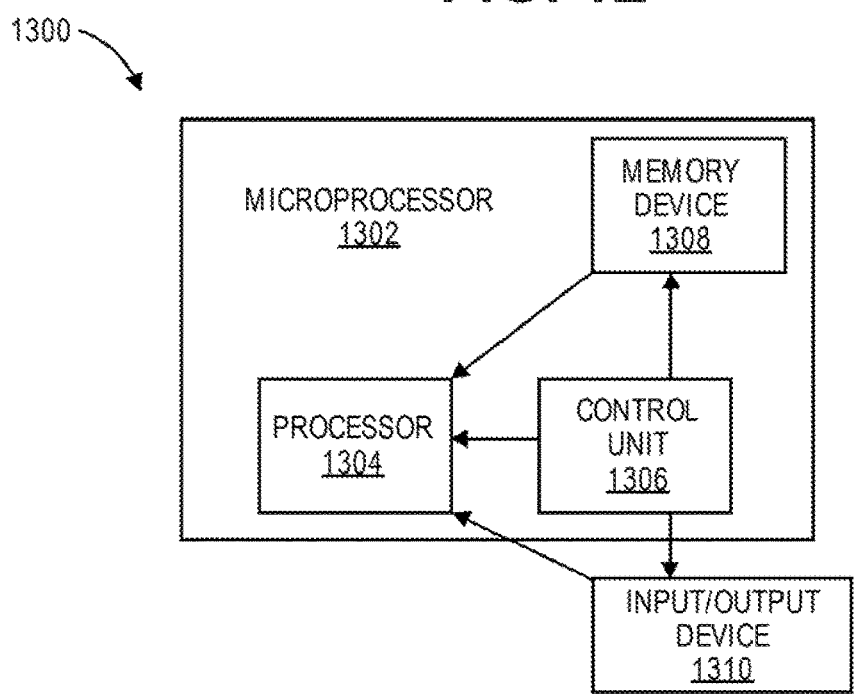
FIG. 13 illustrates a block diagram of an electronic system, in accordance with embodiments of the present invention.

FIG. 13 illustrates a block diagram of an electronic system 1300, in accordance with an embodiment of the present invention. The electronic system 1300 can correspond to, for example, a portable system, a computer system, a process control system, or any other system that utilizes a processor and an associated memory. The electronic system 1300 may include a microprocessor 1302 (having a processor 1304 and control unit 1306), a memory device 1308, and an input/output device 1310 (it is to be appreciated that the electronic system 1300 may have a plurality of processors, control units, memory device units and/or input/output devices in various embodiments). In one embodiment, the electronic system 1300 has a set of instructions that define operations, which are to be performed on data by the processor 1304, as well as, other transactions between the processor 1304, the memory device 1308, and the input/output device 1310. The control unit 1306 coordinates the operations of the processor 1304, the memory device 1308 and the input/output device 1310 by cycling through a set of operations that cause instructions to be retrieved from the memory device 1308 and executed. The memory device 1308 can include a memory element having a conductive oxide and electrode stack as described in the present description. In an embodiment, the memory device 1308 is embedded in the microprocessor 1302, as depicted in FIG. 13. In an embodiment, the processor 1304, or another component of electronic system 1300, includes an array of RRAM devices.

Figure 14:
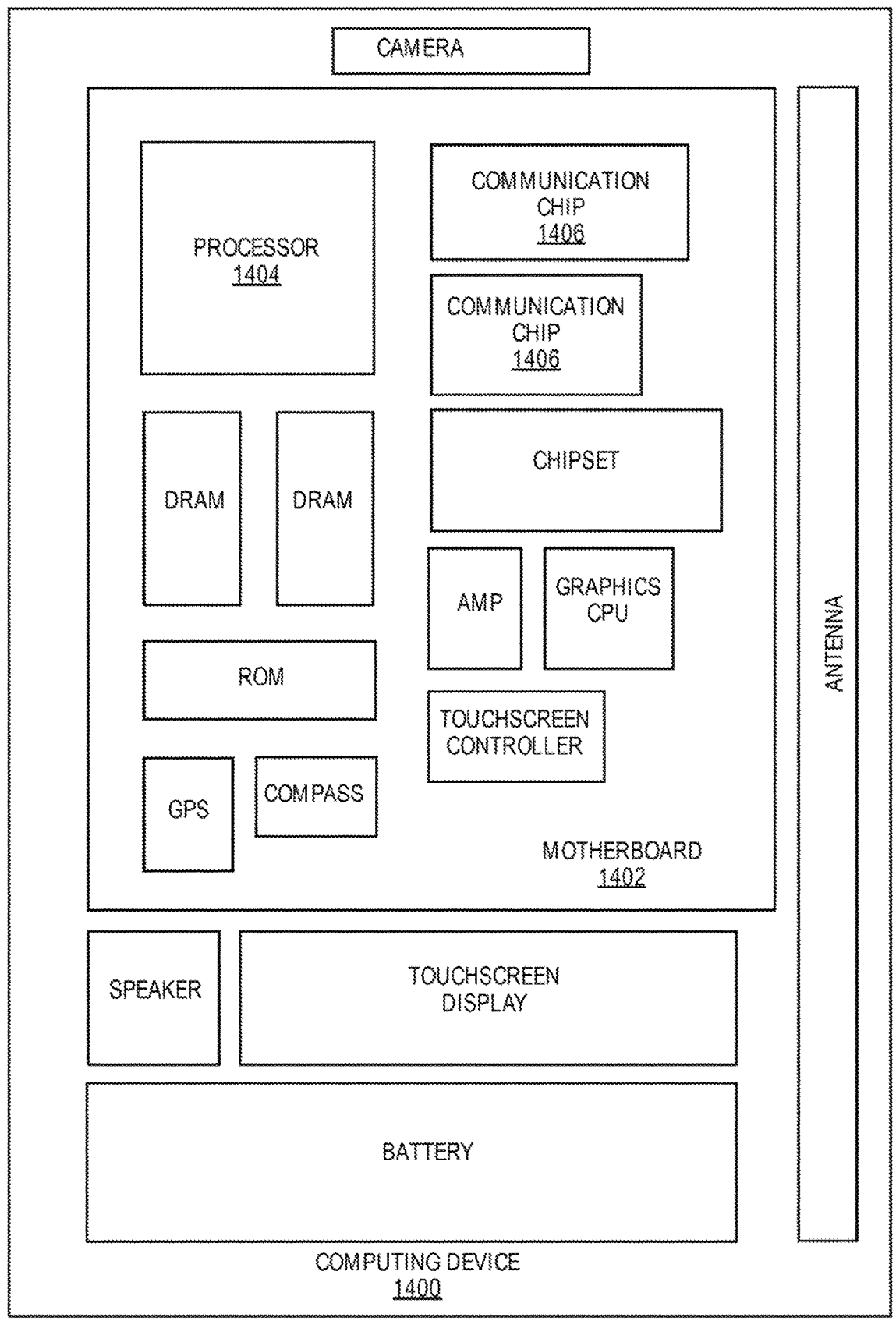
FIG. 14 illustrates a computing device in accordance with embodiments of the present invention.

FIG. 14 illustrates a computing device 1400 in accordance with one embodiment of the invention. The computing device 1400 houses a motherboard 1402. The motherboard 1402 may include a number of components, including but not limited to a processor 1404 and at least one communication chip 1406. The processor 1404 is physically and electrically coupled to the motherboard 1402. In some implementations the at least one communication chip 1406 is also physically and electrically coupled to the motherboard 1402. In further implementations, the communication chip 1406 is part of the processor 1404.

Depending on its applications, computing device 1400 may include other components that may or may not be physically and electrically coupled to the motherboard 1402. These other components include, but are not limited to, volatile memory (e.g., DRAM), non-volatile memory (e.g., ROM), flash memory, a graphics processor, a digital signal processor, a crypto processor, a chipset, an antenna, a display, a touch screen display, a touch screen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter-range wireless communications such as Wi-Fi and Bluetooth and a second communication chip 1406 may be dedicated to longer-range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of embodiments of the invention, the integrated circuit die of the processor includes one or more arrays, such as RRAM memory arrays integrated into a logic processor, built in accordance with embodiments of the present invention. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of an embodiment of the invention, the integrated circuit die of the communication chip includes RRAM memory arrays integrated into a logic processor, built in accordance with embodiments of the present invention.

In further implementations, another component housed within the computing device 1400 may contain a stand-alone integrated circuit memory die that includes one or more arrays, such as RRAM memory arrays integrated into a logic processor, built in accordance with embodiments of the present invention.

In various implementations, the computing device 1400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of RRAM memory arrays integrated into a logic processor. Such arrays may be used in an embedded non-volatile memory, either for its non-volatility, or as a replacement for embedded dynamic random access memory (eDRAM). For example, such an array may be used for 1T-1R memory or 2T-1R memory (R=resistor) at competitive cell sizes within a given technology node.

Figure 15:
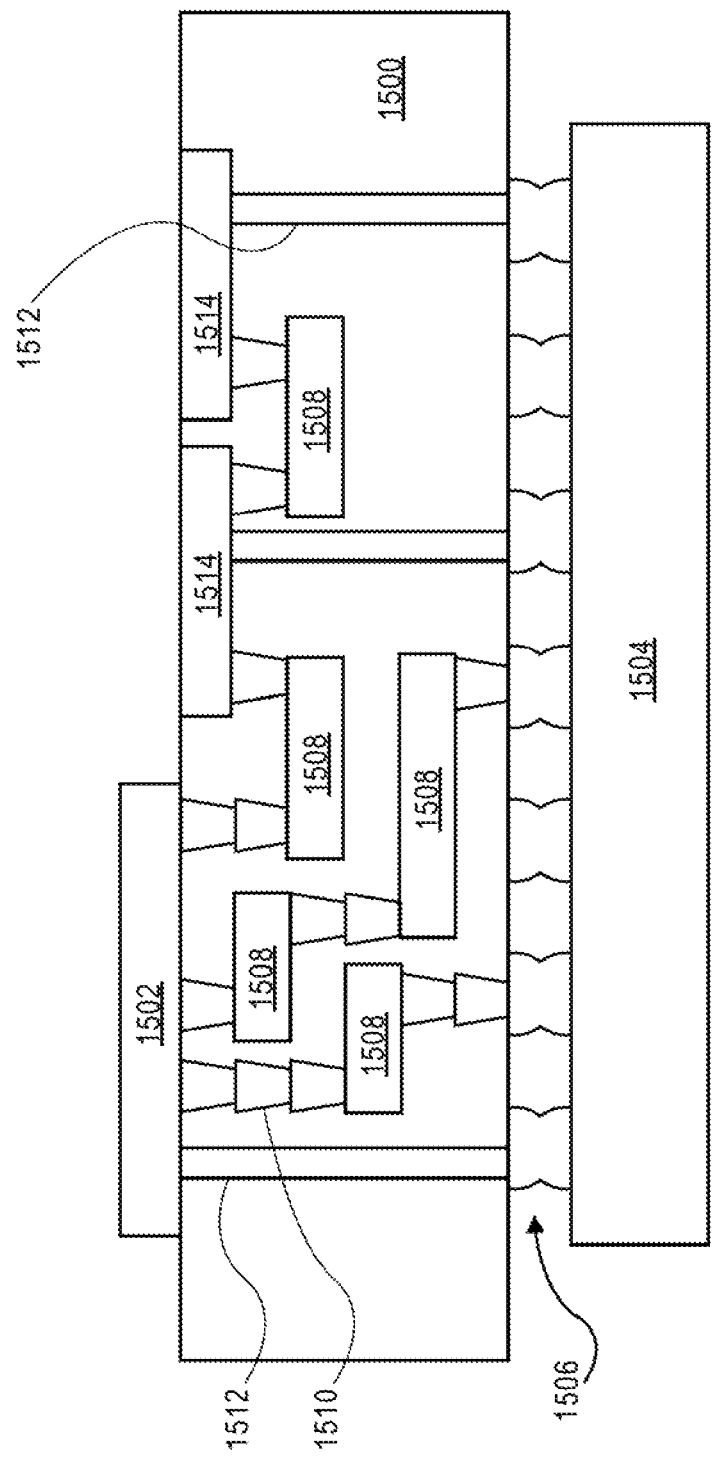
FIG. 15 illustrates an interposer in accordance with embodiments of the present invention.

FIG. 15 illustrates an interposer 1500 that includes one or more embodiments of the invention. The interposer 1500 is an intervening substrate used to bridge a first substrate 1502 to a second substrate 1504. The first substrate 1502 may be, for instance, an integrated circuit die. The second substrate 1504 may be, for instance, a memory module, a computer motherboard, or another integrated circuit die. Generally, the purpose of an interposer 1500 is to spread a connection to a wider pitch or to reroute a connection to a different connection. For example, an interposer 1500 may couple an integrated circuit die to a ball grid array (BGA) 1506 that can subsequently be coupled to the second substrate 1504. In some embodiments, the first and second substrates 1502/1504 are attached to opposing sides of the interposer 1500. In other embodiments, the first and second substrates 1502/1504 are attached to the same side of the interposer 1500. And in further embodiments, three or more substrates are interconnected by way of the interposer 1500.

The interposer 1500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1508 and vias 1510, including but not limited to through-silicon vias (TSVs) 1512. The interposer 1500 may further include embedded devices 1514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1500. In accordance with embodiments of the invention, apparatuses or processes disclosed herein may be used in the fabrication of interposer 1500.

Thus, embodiments of the present invention include RRAM devices and their methods of fabrication.

In an embodiment, a resistive random access memory (RRAM) cell includes a conductive interconnect disposed in a dielectric layer above a substrate. An RRAM device is coupled to the conductive interconnect. An RRAM memory includes a bottom electrode disposed about the conductive interconnect and on a portion of the dielectric layer. A conductive layer is formed on the bottom electrode layer. The conductive layer is separate and distinct from the bottom electrode layer. The conductive layer further includes a material that is different from the bottom electrode layer. A metal oxide switching layer is formed on the conductive layer, an oxygen exchange layer is formed on the metal oxide switching layer and the top electrode is formed on the oxygen exchange.

In one embodiment, the RRAM device stack has sidewalls and includes a bottom electrode, the conductive layer, the metal oxide switching layer, the oxygen exchange and the top electrode. The RRAM device further includes a dielectric spacer layer which surrounds the side walls of the stack and extends from the lowermost portion of the bottom electrode to the uppermost portion of the top electrode.

In one embodiment, the conductive layer and the metal oxide switching includes a metal such as, hafnium, tantalum, and titanium.

In one embodiment, the conductive layer includes a highly oxidizable metal.

In one embodiment, the conductive layer includes an oxygen gradient.

In one embodiment, the metal oxide switching layer has a chemical composition, $MO_{2-x}$, where M is a metal and O is an oxide, where X is approximately in the range from 0 to 0.05.

In one embodiment, the conductive layer has a thickness approximately in the range of 1-3 nanometers, the metal oxide switching layer has a thickness approximately in the range of 2-15 nanometers and the oxygen exchange has a thickness between 5-20 nm.

In one embodiment bottom electrode and the top electrode include a material selected from the group consisting of titanium nitride, tantalum nitride, tungsten and ruthenium.

In an embodiment, a conductive interconnect is formed in a dielectric layer above the substrate. An RRAM device is coupled to the conductive interconnect. The RRAM device includes a bottom electrode formed about the conductive interconnect. The bottom electrode has sidewalls adjacent to the dielectric layer and an upper most surface that is coplanar with the surface of the dielectric layer. An insulating layer is formed above the dielectric layer with an opening with a bottom and sidewalls. A conductive layer is formed in the opening and on the bottom electrode. The conductive layer is conformal with the bottom and sidewalls of the opening. A metal oxide switching layer is formed in the opening on the conductive layer. The metal oxide switching layer is conformal at the bottom and the side walls of the opening. An oxygen exchange is formed in the opening on the metal oxide switching layer, conformal with the bottom and sidewalls of the opening. A top electrode is formed in the opening on the oxygen exchange.

In one embodiment, the conductive layer and the metal oxide switching includes a metal such as, hafnium, tantalum, and titanium.

In one embodiment, the metal oxide switching layer has a chemical composition, $MO_{2-x}$, where M is a metal and O is an oxide, where X is approximately in the range from 0 to 0.05.

In one embodiment, the conductive layer has a thickness approximately in the range of 1-3 nanometers, the metal oxide switching layer has a thickness approximately in the range of 2-15 nanometers and the oxygen exchange has a thickness between 5-20 nm.

In one embodiment bottom electrode and the top electrode include a material selected from the group consisting of titanium nitride, tantalum nitride, tungsten and ruthenium.

In an embodiment, fabricating an RRAM device includes forming a forming a conductive interconnect in a dielectric layer above a substrate, forming a bottom electrode on the conductive interconnect, forming a conductive layer on the bottom electrode, forming a metal oxide switching layer on the conductive layer, forming an oxygen exchange on the metal oxide switching layer and forming a top electrode on the oxygen exchange;

In one embodiment, forming the RRAM device includes forming a dielectric hardmask layer on the top electrode, patterning the dielectric hardmask layer; and using the dielectric hardmask layer as a mask to etch the top electrode, the oxygen exchange, the metal oxide switching layer, the conductive layer and the bottom electrode to form a material layer stack having sidewalls.

In one embodiment, forming the RRAM device further includes forming a dielectric spacer on the sidewalls of the material layer stack. The dielectric spacer extends from a bottom of the bottom electrode to a top of the dielectric hardmask layer.

In one embodiment, conductive layer and the metal oxide switching layer is formed by a physical vapor deposition process.

In one embodiment, the metal oxide switching layer is formed by a using a physical vapor deposition process and simultaneously exposing the metal oxide switching layer to an ambient containing oxygen flow at a constant or a variable rate.

In one embodiment, wherein the top electrode layer is formed on the metal oxide switching layer without an air break post deposition of the metal oxide switching layer.

In an embodiment, forming the RRAM device includes forming a bottom electrode on the conductive interconnect formed in a dielectric layer. The bottom electrode has sidewalls adjacent to the dielectric layer and an uppermost surface coplanar with the uppermost surface of the dielectric layer. An insulating layer is formed above the bottom electrode and the dielectric layer, the insulating layer has an opening and sloped sidewalls. A conductive layer is formed in the opening, on the bottom electrode, conformal with the bottom and the sidewalls of the opening. A metal oxide switching layer is formed in the opening, on the conductive layer, conformal with the bottom and the sidewalls of the opening. An oxygen exchange is formed in the opening, on the metal oxide switching layer. A top electrode is formed in the opening, on the oxygen exchange. A coplanar surface including the insulating layer, conductive layer, the metal oxide switching layer, the oxygen exchange and the top electrode results after planarization.

What is claimed is:

1. An apparatus, comprising:
   a conductive interconnect disposed in a dielectric layer above a substrate;
   a resistive random access memory (RRAM) device coupled to the conductive interconnect, the RRAM device comprising:
      a bottom electrode disposed above the conductive interconnect and on a portion of the dielectric layer;
      a conductive layer disposed on the bottom electrode, the conductive layer separate and distinct from the bottom electrode layer, and a material different from the bottom electrode layer;
      a switching layer including a metal oxide and disposed on the conductive layer;
      an oxygen exchange layer disposed on the switching layer; and
      a top electrode disposed on the oxygen exchange layer.

2. The apparatus of claim 1, wherein the bottom electrode, the conductive layer, the metal oxide switching layer, the oxygen exchange and the top electrode form a stack having sidewalls, and wherein the RRAM device further comprises a dielectric spacer film surrounding the sidewalls of the stack, extending from a lowermost portion of the bottom electrode to the uppermost portion of the top electrode.

3. The apparatus of claim 1, wherein the conductive layer and the switching layer comprise a same metal, the metal selected from the group consisting of hafnium, tantalum and titanium.

4. The apparatus of claim 1, wherein the conductive layer comprises a highly oxidizable metal.

5. The apparatus of claim 1, wherein the conductive layer comprises an oxidized metal with an oxygen gradient.

6. The apparatus of claim 1, wherein the switching layer has a chemical composition, $MO_{2-x}$, where M is a metal and O is an oxygen, where X is approximately in the range from 0 to 0.05.

7. The apparatus of claim 1, wherein the conductive layer has a thickness approximately in the range of 1-3 nanometers, the switching layer has a thickness approximately in the range of 1-5 nanometers and the oxygen exchange has a thickness between 5-20 nm.

8. The apparatus of claim 1, wherein the bottom electrode and the top electrode comprise a material, the material selected from the group consisting of titanium nitride, tantalum nitride, tungsten and ruthenium.

9. An RRAM cell, comprising:
   a conductive interconnect disposed in a dielectric layer above the substrate;
   an RRAM device coupled to the conductive interconnect, the RRAM device comprising:
      a bottom electrode disposed above the conductive interconnect, the bottom electrode having sidewalls adjacent to the dielectric layer and an uppermost surface coplanar with the uppermost surface of the dielectric layer;
      an insulating layer disposed above the dielectric layer, the insulating layer having an opening with a bottom and sidewalls;
      a conductive layer disposed in the opening, on the bottom electrode, conformal with the bottom and the sidewalls of the opening;
      a switching layer disposed in the opening, on the conductive layer, conformal with the bottom and the sidewalls of the opening;
      an oxygen exchange layer disposed in the opening, on the switching layer;
      conformal with the bottom and the sidewalls of the opening;
      a top electrode disposed in the opening, on the oxygen exchange.

10. The RRAM device of claim 9, wherein the conductive layer and the switching layer comprise a same metal, the metal selected from the group consisting of hafnium, tantalum and titanium.

11. The RRAM device of claim 9, wherein the switching layer has a chemical composition, $MO_{2-x}$, where M is a metal and O is an oxygen, where X is approximately in the range from 0 to 0.05.

12. The RRAM device of claim 9, wherein the conductive layer has a thickness approximately in the range of 1-3 nanometers, the switching layer has a thickness approximately in the range of 2-15 nanometers and the oxygen exchange has a thickness between 5-20 nm.

13. The RRAM device of claim 9, wherein the bottom electrode and the top electrode comprise a material, the material selected from the group consisting of titanium nitride, tantalum nitride, tungsten and ruthenium.

14. A method of fabricating a resistive random access memory (RRAM) device, the method comprising:
   forming a conductive interconnect in a dielectric layer above a substrate;
   forming a bottom electrode on the conductive interconnect;
   forming a conductive layer on the bottom electrode;
   at least partially oxidizing the conductive layer;
   forming a switching layer on the at least partially oxidized conductive layer;
   forming an oxygen exchange layer on the switching layer; and forming a top electrode on the oxygen exchange layer.

15. The method of claim 14, wherein forming the RRAM device further comprises:
   forming a dielectric hardmask layer on the top electrode;
   patterning the dielectric hardmask layer; and
   using the patterned dielectric hardmask layer as a mask to etch the top electrode, the oxygen exchange layer, the switching layer, the at least partially oxidized conductive layer and the bottom electrode to form a material layer stack having sidewalls.

16. The method of claim 15, wherein forming the RRAM device further comprises forming a dielectric spacer on the sidewalls of the material layer stack, wherein the dielectric spacer extends from a bottom of the bottom electrode to a top of the dielectric hardmask layer.

17. The method of claim 14, wherein forming the conductive layer and the switching layer comprises using a physical vapor deposition process.

18. The method of claim 14, wherein at least partially oxidizing the conductive layer comprises exposing the conductive layer to an ambient including oxygen gas in a furnace.

19. The method of claim 14, wherein at least partially oxidizing the conductive layer comprises exposing the conductive layer to a plasma including oxygen.

20. The method of claim 14, wherein at least partially oxidizing the conductive layer comprises heating the substrate on a heated chuck with simultaneous exposure to an oxygen flow.

21. The method of claim 14, wherein at least partially oxidizing the conductive layer comprises fully oxidizing the conductive layer.

22. The method of claim 14, wherein the at least partially oxidizing the conductive layer is performed during the forming of the switching layer.

23. The method of claim 14, wherein forming the switching layer comprises depositing using a physical vapor deposition process and simultaneous exposure in an ambience containing oxygen flow at a variable rate.

24. The method of claim 14, wherein the top electrode layer is formed on the oxygen exchange layer without an air break post deposition of the switching layer.

25. The method of claim 14, wherein the bottom electrode has sidewalls adjacent to the dielectric layer and has an uppermost surface coplanar with an uppermost surface of the dielectric layer, the method further comprising:
   forming a second dielectric layer above the bottom electrode and the dielectric layer, the second dielectric layer having an opening with sloped sidewalls, wherein the conductive layer is formed in the opening, on the bottom electrode, conformal with the bottom and the sidewalls of the opening, and wherein the switching layer, the oxygen exchange layer, and the top electrode are formed in the opening.

* * * * *